United States Patent
Seebauer

(10) Patent No.: US 7,968,440 B2
(45) Date of Patent: Jun. 28, 2011

(54) PREPARATION OF ULTRA-SHALLOW SEMICONDUCTOR JUNCTIONS USING INTERMEDIATE TEMPERATURE RAMP RATES AND SOLID INTERFACES FOR DEFECT ENGINEERING

(75) Inventor: Edmund G. Seebauer, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 146 days.

(21) Appl. No.: 12/407,144

(22) Filed: Mar. 19, 2009

(65) Prior Publication Data

US 2010/0048005 A1 Feb. 25, 2010

Related U.S. Application Data

(60) Provisional application No. 61/037,882, filed on Mar. 19, 2008.

(51) Int. Cl.
*H01L 21/425* (2006.01)
*H01L 21/265* (2006.01)

(52) U.S. Cl. .................. 438/514; 438/522; 438/530

(58) Field of Classification Search .................. None
See application file for complete search history.

(56) References Cited

U.S. PATENT DOCUMENTS

| | | |
|---|---|---|
| 3,959,025 A | 5/1976 | Polinsky |
| 4,243,865 A | 1/1981 | Saxena |
| 5,198,372 A * | 3/1993 | Verret ................. 438/330 |
| 5,429,708 A | 7/1995 | Linford et al. |
| 5,627,090 A | 5/1997 | Marukawa et al. |
| 5,731,626 A | 3/1998 | Eaglesham et al. |
| 5,766,695 A | 6/1998 | Nguyen et al. |
| 5,976,956 A | 11/1999 | Gardner et al. |
| 6,043,139 A | 3/2000 | Eaglesham et al. |
| 6,106,898 A | 8/2000 | Takamatsu et al. |
| 6,218,270 B1 | 4/2001 | Yasunaga |
| 6,537,886 B2 | 3/2003 | Lee |
| 6,555,451 B1 | 4/2003 | Kub et al. |
| 6,713,370 B2 | 3/2004 | Falster |
| 6,762,136 B1 | 7/2004 | Bollinger et al. |
| 6,897,118 B1 | 5/2005 | Poon et al. |
| 6,921,933 B2 | 7/2005 | Umimoto et al. |
| 6,941,063 B2 | 9/2005 | Camm et al. |

(Continued)

FOREIGN PATENT DOCUMENTS

JP 06084852 3/1994

(Continued)

OTHER PUBLICATIONS

Baumvol (Dec. 1999) "Atomic Transport During Growth of Ultrathin Dielectrics on Silicon," *Surf. Sci. Rep.* 36(1-8):1-166.

(Continued)

*Primary Examiner* — Scott B Geyer
(74) *Attorney, Agent, or Firm* — Greenlee Sullivan P.C.

(57) ABSTRACT

Described herein are processing conditions, techniques, and methods for preparation of ultra-shallow semiconductor junctions. Methods described herein utilize semiconductor surface processing or modification to limit the extent of dopant diffusion under annealing conditions (e.g. temperature ramp rates between 100 and 5000° C./second) previously thought impractical for the preparation of ultra-shallow semiconductor junctions. Also described herein are techniques for preparation of ultra-shallow semiconductor junctions utilizing the presence of a solid interface for control of dopant diffusion and activation.

76 Claims, 16 Drawing Sheets

1. Provide Semiconductor

2. Implant Semiconductor with Dopants

3. Treat Semiconductor with Surface Modification Agent

4. Anneal Semiconductor at 1200-5000 °C/s

U.S. PATENT DOCUMENTS

| | | | |
|---|---|---|---|
| 2001/0002709 A1 | 6/2001 | Wallace et al. | |
| 2002/0139975 A1 | 10/2002 | Lewis et al. | |
| 2003/0054641 A1 | 3/2003 | Binns et al. | |
| 2003/0068866 A1 | 4/2003 | Chen et al. | |
| 2003/0124821 A1* | 7/2003 | Robertson | 438/514 |
| 2006/0024928 A1 | 2/2006 | Seebauer et al. | |
| 2006/0024934 A1 | 2/2006 | Chan et al. | |
| 2007/0099402 A1* | 5/2007 | Tseng et al. | 438/489 |
| 2008/0014763 A1* | 1/2008 | Lu et al. | 438/795 |
| 2010/0276733 A1* | 11/2010 | Li | 257/252 |

FOREIGN PATENT DOCUMENTS

| | | |
|---|---|---|
| WO | WO 98/20525 | 5/1998 |
| WO | WO 01/80295 | 10/2001 |
| WO | WO 03/018465 | 3/2003 |
| WO | WO 03/049163 | 6/2003 |
| WO | WO 03/063218 | 7/2003 |

OTHER PUBLICATIONS

Bonasewicz et al. (1982) "Diffusion of Zinc and Oxygen in Nonstoichiometric Zinc Oxide," *Transport in Non-Stoichiometric Compounds. Proceedings of the First International Conference*, , pp. 153-174.

Bond, G.C. (1997) "Preparation and Properties of Vanadia/Titania Monolayer Catalysts," *Appl. Catalysis A* 157:91-103.

Boyes et al. (Feb. 21, 1985) "Cathodoluminescence of Catalyst Crystallites," *Nature* 313:666-668.

Bracht et al. (Jul. 13, 1998) "Silicon Self-Diffusion in Isotope Heterostructurs," *Phys. Rev. Lett.* 81(2):393-396.

Bu et al. (1994) "Surface Chemistry of $N_2H_2$ on Si(100)-2x1," *Surf. Sci.* 311:385-394.

Bush et al. (1994) "The Sodium Promoted Nitridation of Si(100)-2x1 Using $N_2$ Molecular Beams," *Surf. Sci.* 313:179-187.

Campbell, S.A. (2001) *The Science and Engineering of Microelectronic Fabrication*, $2^{nd}$ ed., New York, Oxford, pp. 16-21,98-122.

Chadi et al. (Oct. 12, 1987) "Stabilities of Single-Layer and Bilayer Steps on Si(001) Surfaces," *Phys. Rev. Lett.* 59(15):1691-1694.

Cherif et al. (1991) "Surface Properties of Si(111) 7x7 Upon NH3 Adsorption and Vacuum Annealing," *Surf. Sci.* 351:113-120.

Cowern et al. (1997) "Low Energy Implantation and Transient Enhanced Diffusion: Physical Mechanisms and Technology Implications," *Mat. Res. Soc. Symp. Proc.* 469:265-276.

Cowern et al. (Nov. 5, 1990) "Impurity Diffusion Via an Intermediate Species: The B-Si System," *Phys. Rev. Lett.* 65(19):2434-2437.

Current et al. (1993) "Defect Engineering of $P^+$-Junctions by Multiple-Species Ion Implantation," *Nucl. Instrum. Meth. Phys. Res. B* 74:175-180.

Demond et al. (Feb. 14, 1983) "Study of Si Self-Diffusion by Nuclear Techniques," *Phys. Lett.* 93A(19):503-506.

Dev et al. (Nov. 11, 2003) "Mechanism for Coupling Between Properties of Interfaces and Bulk Semiconductors," *Phys. Rev. B* 68:195311.

Dev et al. (Web Release Apr. 7, 2005) "Band Bending at the Si(100)-$Si_3N_4$ Interface Studied by Photoreflectance Spectroscopy," *Surf. Sci.* 583:80-87.

Dev et al. (2004) "Band Bending at the Si(111)-$SiO_2$ Interface Induced by Low-Energy Ion Bombardment," *Surf. Sci.* 550:185-191.

Dev et al. (2002) "Measurement of Fermi Pinning at Si-SiO2 Interfaces: Implications for TED Spike Anneals," *Rapid Thermal and Other Short-Time Processing Technologies III* (ECS vol. PV-2002-11) :357-362.

Diamant et al. (Web Release Feb. 11, 2003) "Core-Shell Nanoporous Electrode for Dye Sensitized Solar Cells," *J. Phys. Chem. B* 107:1977-1981.

Downey et al. (1999) "Effects of 'Fast' Rapid Thermal Anneals on Sub-keV Boron and $BF_2$ Ion Implants," *J. Electronic Mater.* 28(12):1340-1343.

Drucker et al. (1991) "Biased Secondary Electron Imaging of Monatomic Surface Steps on Vicinal Si(100) in a UHV STEM," *Ultramicroscopy* 35:323-328.

Du et al. (May 1990) "Activation Energy Distribution in Temperature-Programmed Desorption: Modeling and Application to the Soot-Oxygen System," *Energy and Fuels* 4(3):296-302.

Dufour et al. (1994) "Contrasted Behavior of Si(001) and Si(111) Surfaces to NH/sub 3/ Adsorption and Thermal Nitridation: A N 1s and Si 2p Core Level Study with Sychrotron Radiation," *Surf. Sci.* 304:33-.

Fahey et al. (Apr. 1989) "Point Defects and Dopant Diffusion in Silicon," *Rev. Mod. Phys.* 61(2):289-384.

Fan et al. (May 15, 1990) "Role of Recoil Implanted Oxygen in Determining Boron Diffusion in Silicon," *J. Appl. Phys.* 67(10):6135-6140.

Franco et al. (Jul. 28, 1997) "Local Structure of $NH_2$ on Si(100)-(2x1) and Its Effect on the Asymmetry of the Si Surface Dimers," *Phys. Rev. Lett.* 79(4):673-676.

Frank et al. (1984) "Diffusion in Silicon and Germanium," In; *Diffusion in Crystalline Solids*, Murch et al. Eds., Academic Press, New York, pp. 63-142.

Fukami et al. (Jul. 1, 2002) "Effects of Sputtering Atmosphere Oxygen Pressure on Photocatalytic Phenomena in Anatase Films," *Jap. J. Appl. Phys.*, Part 2 Lett. 41:L794-L796.

Fukata et al. (Aug. 15, 2001) "Vacancy Formation Energy of Silicon Determined by a New Quenching Method," *Jpn. J. Appl. Phys.* 40:L854-L856.

Gao et al. (1996) "Thermal Stability and the Role of Oxygen Vacancy Defects in Strong Metal Support Interaction—Pt on Nb-Doped $TiO_2(100)$," *Surf. Sci.* 365:638-648.

Gossmann et al. (Sep. 11, 1995) Behavior of Intrinsic Si Point Defects During Annealing in Vacuum, *Appl. Phys. Lett.* 75:1558-1560.

Gratzel, M. (Nov. 15, 2001) "Photoelectrochemical Cells," *Nature* 414:338-344.

Gunawan et al. (Web Release Oct. 10, 2003) "Parameter Sensitivity Analysis Applied to Modeling Transient Enhanced Diffusion and Activation of Boron in Silicon," *J. Electrochem. Soc.* 150(12):G758-G765.

Gunawan et al. (Aug. 2003) "Maximum *A Posteriori* Estimation of Transient Enhanced Diffusion Energetics," *AIChE J.* 49(8):2114-2123.

Haber et al. (1997) "Vanadium Pentoxide I: Structure and Properties," *Appl. Catal. A* 157:3-22.

Hakala et al. (Mar. 15, 2000) "First-Principles Calculations of Interstitial Boron in Silicon," *Phys. Rev. B* 61(12):8155-8161.

Hersam et al. (Feb. 12, 2001) "Atomic-Level Study of the Robustness of the Si(100)-2x1:H Surface Following Exposure to Ambient Conditions," *Appl. Phys. Lett.* 78(7):886-888.

Hirvonen et al. (Nov. 1, 1979) "Self-Diffusion in Silicon as Probed by the (p,γ) Resonance Broadening Method," *Appl. Phys. Lett.* 35(9):703-705.

Hlil et al. (Apr. 15, 1987) "Photoemission Study of Ammonia Dissociation on Si(100) Below 700K," *Phys. Rev. B.* 35(11):5913-5916.

Jain et al. (Jun. 1, 2002) "Transient Enhanced Diffusion of Boron in Si," *J. Appl. Phys.* 91(11):8919-8941.

Jana et al. (2002) "Low Temperature Silicon Oxide and Nitride for Surface Passivation of Silicon Solar Cells," *Solar Energy Mater. Solar Cells* 71:197-211.

Jung et al. (Feb. 1, 2004) "Effect of Near-Surface Band Bending on Dopant Profiles in Ion-Implanted Silicon," *J. Appl. Phys* 95(3):1134-1140.

Jung et al. (2004) "Pair Diffusion and Kick-Out: Contributions to Diffusion of Boron in Silicon," *AIChE J.* 50:3248-3256.

Jung et al. (Web Release Nov. 3, 2003) "Ramp-Rate Effects on Transient Enhanced Diffusion and Dopant Activation," *J. Electrochem. Soc.* 150(12):G838-G842.

Jung et al. (Web Release Nov. 18, 2003) "A Simplified Picture for Transient Enhanced Diffusion of Boron in Silicon," *J. Electrochem. Soc.* 151(1):G1-G7.

Kato et al. (1996) "Adsorbed State and Thermal Reactions of $_{N2O}$ on Si(100) Below Room Temperature: Desorption Induced by Dissociations," *Surf. Sci.* 351:43-52.

Kirichenko et al. (Jul. 7, 2004) "Interactions of Neutral Vacancies and Interstitials with the Si(001) Surface," *Phys. Rev. B* 70:045321:1-7.

Kirichenko et al. (Web Release Jul. 28, 2004) "Surface Chemistry Effects on Vacancy and Interstitial Annihilation on Si(001)," *Physica Status Solidi B* 241(10):2303-2312.

Lee et al. (Aug. 15, 1998) "First-Principles Study of the Dissociative Adsorption of $NH_3$ on the Si(100) Surface," *Phys. Rev. B* 58(8):4903-4908.

Loh et al. (1995) "The Interaction of Azomethane with Si(100)," 341:92-102.

Masters et al. (Jun. 1, 1966) "Silicon Self-Diffusion," *Appl. Phys. Lett.* 8(11):280-281.

McCarty et al. (Aug. 9, 2001) "Vacancies in Solids and the Stability of Surface Morphology," *Nature* 412:622-625.

Moslehi et al. (Feb. 1985) "Thermal Nitridation of Si and $SiO_2$ for VLSI," *IEEE Trans. Electron. Dev.* 32(2):106-123.

Nakabayashi et al. (Jun.2003) "Self-Diffusion in Intrinsic and Extrinsic Silicon Using Isotopically Pure $^{30}$Silicon/Natural Silicon Heterostructures," *Jpn. J. Appl. Phys.* 42:3304-3310.

Niimi et al. (Nov./Dec. 1999) "Monolayer-Level Controlled Incorporation of Nitrogen at $Si-SiO_2$ Interfaces Using Remote Plasma Processing," *J. Vac. Sci. Technol.* 17(6):3185-3196.

Office Actions and Responses, Corresponding to U.S. Appl. No. 11/192,339, Mailed Between Jun. 29, 2007 and Oct. 26, 2009.

Okino et al. (Nov. 1997) "Self-Interstitials in Silicon," *Jpn. J. Appl. Phys.* 36:6591-6594.

Paloura et al. (Jul. 14, 1986) "Silicon nitride films grown on silicon below 300 °C in low power nitrogen plasma," *Appl. Phys. Lett.* 45(2):97-99.

Quirk et al. (2001) "Ion Implant," In; *Semiconductor Manufacturing Technology*, Ch. 17, Prentice Hall, Upper Saddle River, N.J. pp. 475-510.

Riehl-Chudoba et al. (1994) "Nitric Oxide Adsorption on the Si(111) 7x7 Surface: Effect of Potassium Overlayers," *Surf. Sci.* 243:313-326.

Roberts et al. (1990) "Total Energy Calculations of Dimer Reconstructions on the Silicon (001) Surface," *Surf. Sci.* 236:112-121.

Robin et al. (Aug. 1973) "Application of a Nondestructive Single-Spectrum Proton Activation Technique to Study Oxygen Diffusion in Zinc Oxide," *J. Appl. Phys.* 44(8):3770-3777.

Robinson et al. (1999) "A Surface Chemistry Investigation of the Low Pressure Nitridation of Si(100) Using 1,1-Dimerhylhydrazine," *Appl. Surf. Sci.* 152:85-98.

Rodriguez et al. (Web Release Sep. 7, 2001) "Chemistry of $NO_2$ on Oxide Surfaces: Formation of $NO_3$ on $TiO_2(110)$ and $NO_2$-O Vacancy Interactions," *J. Am. Chem. Soc.* 123:9597-9605.

Rodriguez et al. (2002) "Activation of Gold on Titania: Adsorption and Reaction of $SO_2$ on $Au/TiO_2(110)$," *J. Am. Chem. Soc.* 124:5242-5250.

Seebauer, E.G. (1994) "Quantitative Extraction of Continuous Distributions of Energy States and Pre-Exponential Factors from Thermal Desorption Spectra," *Surf. Sci.* 316:391-405.

Seebauer, E.G. (Mar. 15-16, 2004) "Surface Control of Interstitial Behavior for Improved Ultrashallow Junction Formation," *IEEE 4$^{th}$ Int. Workshop on Junction Technology* IWJT'04, pp. 81-86.

Shao et al. (2003) "Boron Diffusion in Silicon: The Anomalies and Control by Point Defect Engineering," *Mat. Sci. Eng.* R42:65-114.

Sharp et al. (2002) "Self- and Dopant Diffusion in Extrinsic Boron Doped Isotopically Controlled Silicon Multilayer Structures," *Mat. Res. Soc. Symp. Proc.* 719:433-438.

Shewmon, P. (1989) *Diffusion in Solids*, Warrendale, PA, Metals and Materials Soc., pp. 98-122.

Silvestry et al. (2002) "Dopant and Self-Diffusion in Extrinsic n-Type Silicon Isotopically Controlled Hetterostructures," *Mat. Res. Soc. Symp. Proc.* 719:427-432.

Smith et al. (Jun. 1982) "Reaction of Oxygen with Si(111) and (100): Critical Conditions for the Growth of SiO2," *J. Electrochem. Soc.* 129(6):1300-1306.

Takami et al. (Mar. 20, 1995) "Monolayer Nitridation of Silicon Surfaces by a Dry Chemical Process Using Dimethylhydrazine or Ammonia,"*Appl. Phys. Lett.* 66(12):1527-1529.

Takeda et al. (2001) "Photocatalytic $TiO_2$ Thin Film Deposited onto Glass by DC Magnetron Sputtering," *Thin Solid Films* 392:338-344.

Ural et al. (Oct. 25, 1999) "Self-Diffusion in Silicon: Similarity Between the Properties of Native Point Defects," *Phys. Rev. Lett.* 83(17):3454-3457.

Ural et al. (Sep. 21, 1998) "Experimental Evidence for a Dual Vacancy-Interstitial Mechanism of Self-Diffusion in Silicon," *Appl. Phys. Lett.* 73(12):1706-1708.

Vaidyanathan et al. (Web Release Oct. 11, 2006) "Influence of Surface Adsorption in Improving Ultrashallow Junction Formation," *Appl. Phys. Lett.* 89:152114.

Van Vechten (Nov. 15, 1988) "Activation Enthalpy of Recombination Vacancy Migration in Si," *Phys. Rev. B* 38(14):9913-9919.

Voronkov et al. (2000) "The Sensitivity of Thermal Donor Generation in Silicon to Self-Interstitial Sinks," *J. Electrochem. Soc.* 147:3899-3906.

Wachs et al. (1997) "Structure and Reactivity of Surface Vanadium Oxide Species on Oxide Supports," *Appl. Catalysis A* 157:67-90.

Wantanabe et al. (Web Release May 23, 2004) "Direct-Bandgap Properties and Evidence for Ultraviolet Lasing of Hexagonal Boron Nitride Single Crystal," *Nature Mat.* 3:404-409.

Wuensch et al. (1994) "Lattice Diffusion, Grain Boundary Diffusion and Defect Structure of ZnO," *J. Phys. Chem. Solids* 55(10):975-984.

Xu et al. (Web Release Oct. 31, 2007) "Built-In Electric Field Enhancement/Retardation on Intermixing," *Appl. Phys. Lett.* 91:181111.

Yeong et al. (Web Release Sep. 6, 2007) "Defect Engineering by Surface Chemical State in Boron-Doped Pre-amorphized Silicon," *Appl. Phys. Lett.* 91:102112.

Advani et al. (1980) "Oxygen Vacancy Diffusion in $SnO_2$ Thin Films," *Int. J. Electronics* 48(5):403-411.

Allen et al. (Jan./Feb. 1996) "Surface Diffusion of In on Si(111): Evidence for Surface Ionization Effects," *J. Vac. Sci. Technol.* A14(1):22-29.

Aspnes, D.E. (Jun. 1973) "Third-Derivative Modulation Spectroscopy with Low-Field Electroreflectance," *Surf. Sci.* 37:418-442.

Aspnes et al. (Jul. 26, 1971) "High-Resolution Interband-Energy Measurements from Electroreflectance Spectra," *Phys. Rev. Lett.* 27(4):188-190.

Baumberger et al. (Dec. 15, 2000) "Step-Induced One-Dimensional Surface State on Cu(332)," *Phys. Rev. B.* 62(23):15431-15434.

Bernasik et al. (1994) "Electrical Surface Versus Bulk Properties of Fe-Doped $TiO_2$ Single Crystals," *Solid State Ionics* 72:12-18.

Bracht et al. (Nov. 2, 2000) "Large Disparity Between Gallium and Antimony Self-Diffusion in Gallium Antimonide," *Nature* 408:69-72.

Cardona et al. (Feb. 15, 1967) "Electroreflectance at Semiconductor-Electrolyte Interface," *Phys. Rev.* 154(3):696-720.

Carlson et al. (Nov. 1, 1993) "Adsorption/Desorption Kinetics of $H_2O$ on GaAs(100) Measured by Photoreflectance," *J. Chem. Phys.* 99(9):7190-7197.

Castellanos et al. (Mar. 1, 1993) "Surface Magnetism: A Monte Carlo Study of Surface Critical Behavior," *Phys. Rev. B* 47(9):5037-5040.

Cowern et al. (Dec. 15, 1990) "Transient Diffusion of Ion-Implanted B in SI: Dose Time and Matrix Dependence of Atomic and Electrical Profiles," *J. Appl. Phys.* 68(12):6191-6196.

Dalton et al. (2004) "Structure and Mobility on Amorphous Silicon Surfaces," *Surf. Sci.* 550:140-148.

David et al. (1989) "Coherent Surface Fluorescence Versus Thermally Activated Energy Transfer to the Bulk in the Anthracene Crystal: Model Calculations and Some Experimental Results," *Chem. Phys.* 132:31-39.

Dev et al. (2003) "Surface Vacancy Charging on Semiconductors at Nonzero Temperatures," *Phys. Rev. B.* 67:035312(1-4).

Dev et al. (2003) "Vacancy Charging on Si(111)-(7x7) Investigated by Density Functional Theory," *Surf. Sci.* 538:L495-L499.

Ditchfield et al. (Aug. 10, 1998) "Nonthermal Effects of Photon Illumination on Surface Diffusion," *Phys. Rev. Lett.* 81(6):1259-1262.

Ditchflield et al. (May 15, 2000) "Semiconductor Surface Diffusion: Nonthermal Effects of Photon Illumination," *Phys. Rev. B* 61(20):13710-13720.

Ditchfield et al. (Feb. 8, 1999) "Direct Measurement of Ion-Influences Surface Diffusion," *Phys. Rev. Lett.* 82(6):1185-1188.

Ditchfield et al. (2001) "Semiconductor Surface Diffusion: Effects of Low-Energy Ion Bombardment," *Phys. Rev. B.* 63:125317.

Fair et al. (Apr. 15, 1998) "Photonic Effects in the Deactivation of Ion Implanted Arsenic," *J. Appl. Phys.* 83(8):4081-4090.

Gunawan et al. (2002) "Identification of Kinetic Parameters in a Multidimensional Crystallization Process," *Int. J. Modern. Phys. B* 16(1-2):367-374.

Gunawan et al. (2004) "Optimal Control of Rapid Thermal Annealing in a Semiconductor Process," *J. Process Control* 14:423-430.

Gyulai et al. (Jan. 1994) "Athermal Effects in Ion Implanted Layers," *Rad. Effects Defects Solids* 127:397-404.

Hallen et al. (Jul. 7. 1999) "Migration Energy for the Silicon Self-Interstitial," *J. Appl. Phys.* 86(1):214-216.

Heinrich et al. (May 31, 1976) "Observation of Two-Dimensional Phases Associated with Defect States on the Surface of $TiO_2$," *Phys. Rev. Lett.* 36(22):1335-1339.

Hermann et al. (1999) "Electronic Properties, Structure and Adsorption at Vanadium Oxide: Density Functional Studies," *Faraday Discuss* 114:53-66.

Hoffmann et al. (Jan. 1995) "Environmental Applications of Semiconductor Photocatalysis," *Chem. Rev.* 95(1):69-96.

Hori et al. (1986) "Rapid Oxidation of No to $NO_2$ at ppm Concentration Level in a Heterogeneous Photocatalytic Reaction on Metal Oxide Powders," *Chem. Lett.* 15:(11):1845-1848.

Hoshino et al. (1985) "Diffusion and Point Defects in $TiO_{2-x}$," *J. Phys. Chem. Solids* 46(12):1397-1411.

Ibusuki et al. (Feb. 22, 1994) "Removal of Low Concentration Nitrogen Oxides Through Photoassisted Heterogeneous Catalysis," *J. Mol. Catal.* 88(1):93-102.

Ishikawa et al. (Dec. 1997) "Diffusion of Phosphorus and Boron into Silicon at Low Temperatures by Heating with Light Irradiation," *Jpn. J. Appl. Phys.* 36:7433-7436.

Jung et al. (2002) "Measurement of Nonthermal Illumination-Enhanced Diffusion in Silicon," In; *Rapid Thermal and Other Short-Time Processing Technologies III*, Electrochemical Society.

Jung et al. (2002) "Measurement of Nonthermal Illumination-Enhanced Diffusion in Silicon," *Proceedings of the 10th IEEE International Conference on Advanced Thermal Processing of Semiconductors* 133-135.

Kanata et al. (Nov. 15, 1990) "Photoreflectance Characterization of Surface Fermi Level in as-Grown GaAs(100)," *J. Appl. Phys.* 68(10):5309-5313.

Kapoor et al. (Feb. 1997) "Measurement of Solid State Diffusion Coefficients by a Temperature-Programmed Method," *J. Mater. Res.* 12(2):467-473.

Kase et al. (Sep. 1995) "Photoassisted Chemisorption of NO on ZnO," *J. Phys. Chem.* 99(36):13307-13309.

Kim et al. (2000) "Annealing of $CH_3I$ Films on $TiO_2$(110) Studied with TPD and UV-Induced Esorption," *Surf. Sci.* 445:177-185.

Kisliuk (1957) "The Sticking Probabilities of Gases Chemisorbed on the Surfaces of Solids," *J. Phys. Chem. Solids* 3:95-101.

Kisliuk (1958) "The Sticking Probabilities of Gases Chemisorbed on the Surfaces of Solids-II," *J. Phys. Chem. Solids* 5:78-84.

Kondo et al. (Aug. 15, 1976) "Symmetry Analysis and Uniaxial-Stress Effect on the Low Field Electroreflectance of Si from 3.0 to 4.0 eV," *Phys. Rev. B* 14(4):1577-1592.

Kwok et al. (2005) "A Method for Quantifying Annihilation Rates of Bulk Point Defects at Surfaces," *J. Appl. Phys.* 98:013524.

Kwok, TSZ Mei (2007) "Advanced Methods for Defect Engineering in Silicon," PhD Thesis, University of Illinois, 233 pages.

Lambrecht et al. (1983) "Electronic Structure of Bulk and Surface Vanadyl Oxygen Vacancies in the Layer Compound $V_2O_5$," *Surf. Sci.* 126:558-564.

Lautenschlager et al. (Sep. 15, 1987) "Temperature Dependence of the Dielectric Function and Interband Critical Points in Silicon," *Phys. Rev. B* 36(9):4821-4830.

Lee et al. (1998) "First-Principles Study of the Self-Interstitial Diffusion Mechanism in Silicon," *J. Phys Condens. Matter* 10:995-1002.

Lerch et al. (1999) "Boron Ultrashadow Junction Formation in Silicon by Low Energy Implantation and Rapid Thermal Annealing in Inert and Oxidizing Ambient," *J. Electrochem. Soc.* 146(7):2670-2678.

Li et al. (2002) "Gas Sensing Properties of p-Type Semiconducting Cr-Doped $TiO_2$ Thin Films," *Sens. Actuators B* 83:160-163.

Lojek et al. (2001) "Athermal Annealing of Ion-Implanted Silicon," *9th Int. Conference on Advnaced Thermal Processing of Semiconductors-RTP'* 2001 :125-131.

Ma et al. (Web Release Mar. 15, 2003) "Robust Identification and Control of Batch Processes," *Comp. Chem. Eng.* 27:1175-1184.

Mariz et al. (Jan. 1, 1987) "Influence of the Interaction Anisotropy on the Appearance of Surface Magnetism," *Europhysics Lett.* 3(1):27-31.

Mata et al. (Oct. 1, 1982) "Thin Ferromagnetic Films on Nonmagnetic Metallic Substrates: A Model Calculation," *Phys. Rev. B* 26(7):3841-3845.

McEllistren et al. (Apr. 19, 1993) "Electrostatic Sample-Tip Interactions in the Scanning Tunneling Microscope," *Phys. Rev. Lett.* 70(16): 2471-2474.

Mendicino et al. (1993) "Detailed In-Situ Monitoring of Film Growth: Application to $TiSi_2$ CVD," *J. Cryst. Growth* 134:377-385.

Millot et al. (1988) "Oxygen Self-Diffusion in Non-Stoichiometric Rutile $TiO_{2-x}$ at High Temperature," *Solid State Ionics* 28-30:1344-1348.

Miotto et al. (2003) "Adsorption of $NH_3$ on Ge(001)," *Phys. Rev. B* 68:115436.

Noel et al. (1998) "Optical Effects During Rapid Thermal Diffusion," *J. Electron. Mat.* 27(12):1315-1322.

Noel et al. (May 18, 1998) "Impact of Ultraviolet Light During Rapid Thermal Diffusion," *Appl. Phys. Lett.* 72(20):2583-2585.

Office Action and Response, Corresponding to U.S. Appl. No. 11/192,339, Mailed between May 10, 2010 and Aug. 27, 2010.

Pichat et al. (Feb. 1982) "Photocatalytic Oxidation of Various Compounds over $TiO_2$ and Other Semiconductor Oxides: Mechanistic Considerations," *Can. J. Chem. Eng.* 60(1):27-32.

Poniewierski et al. (Mar. 1996) "Anchoring of Nematic Liquid Crystals at a Solid Substrate," *Phys. Rev. E* 53(3):2436-2443.

Quirk et al. (2001) "Silicon and Wafer Preparation," In; *Semiconductor Manufacturing Technology*, Ch. 4, Prentice Hall, Upper Saddle River, NJ, pp. 67-90.

Rafferty, C.S. (2000) "Front-End Process Simulation," *Solid-State Electronics* 44:863-868.

Ramirex et al. (1990) "Oxygen Reactivity in Vanadium Pantoxide. Electronic Structure and Infrared Spectroscopy Studies," *J. Phys. Chem.* 94(26):8960-8965.

Rangan et al. (Mar./Apr. 2003) "Influence of Hydrogen Plasma Treatment on Boron Implanted Junctions in Silicon," *J. Vac. Sci. Technol. B* 21(2):781-784.

Rusi et al. (1997) "Defect Sites on $TiO_2$(110). Detection by $O_2$ Photodesorption," *Langmuir* 13(16):4311-4316.

Salvador, P. (1992) "Dynamic Electrolyte Electroreflectance Measurements for the In Situ Detection of Flatband Potential Shifts," *Electrochimica Acta* 37(5):957-971.

Schultz et al. (Nov. 1, 1992) "Surface Diffusion of Sb on Ge(111) Monitored Quantitatively with Optical Second Harmonic Microscopy," *J. Chem. Phys.* 97(9):6958.

Schultz et al. (Mar. 1993) "Microscopy of Adsorbates by Surface Second-Harmonic Generation," *J. Opt. Soc. Am. B* 10(3):546-550.

Shen et al. (1988) Photoreflectance of GaAs and $Ga_{0.82}Al_{0.18}As$ at Elevated Temperature up to 600 degrees C, *Appl. Phys. Lett* 53:1080-1082.

Shultz et al. (1995) "Comparative Second Harmonic Generation and X-Ray Photoelectron Spectroscopy Studies of the UV Creation and $O_2$ Healing of $Ti^{3+}$ Defects on (110) Rutile $TiO_2$ Surfaces," *Surf. Sci.* 339:114-124.

Szczepankiewics et al. (Web Release Oct. 4, 2000) "Infrared Spectra of Photoinduced Species on Hydroxylated Titania Surfaces," *J. Phys. Chem. B* 104:9842-9850.

Tomlins et al. (Jan. 1, 2000) "Zinc Self-Diffusion, Electrical Properties, and Defect Structure of Undoped, Single Crystal Zinc Oxide," *J. Appl. Phys.* 87(1):117-123.

Ural et al. (May 1, 1999) "Fractional Contributions of Microscopic Diffusion Mechanisms for Common Dopants and Self-Diffusion in Silicon," *J. Appl. Phys.* 85(9):6440-6446.

Ural et al. (1999) "Nonequilibrium Experiments on Self-Diffusion in Silicon at Low Temperatures Using Isotopically Enriched Structures," *Physica B* 273-274:512-515.

Vaidyanathan et al. (2006) "Measurement of Defect-Mediated Diffusion: The Case of Silicon Self Diffusion," *AIChE J.* 52(1):366-370.

Vaidyanathan, Ramakrishnan (2007) "New Forms of Defect Engineering in Silicon and Metal Oxides Semiconductors," PhD Thesis, University of Illinois, 187 pages.

Van Vechten, J.A. (Feb. 15, 1988) "Divacancy Binding Enthalpy and Contribution of Divacancies to Self-Diffusion in Si," *Phys. Rev. B* 33(4):2674-2689.

Venkatu et al. (1970) "Diffusion of Titanium in Single Crystal Rutile," *Mater. Sci. Eng.* 5:258-262.

Vitomirov et al. (Aug. 15, 1989) "Reversible Temperature-Dependent Fermi-Level Movement for Metal-GaAs(110) Interfaces," *Phys. Rev. B* 40(5):3483-3486.

Wang et al. (Apr. 15, 1993) Dimer Vacancies and Dimer-Vacancy Complexes on the Si(100) Surface, *Phys. Rev. B* 47(16):10497-10508.

Wieser et al. (1984) "Influence of Flash-Lamp Annealing on the Diffusion Behavior of Ion Implanted Boron Profiles," *Phys. Stat. Sol. A* 81:247-252.

Yeung et al. (2003) "Vacancy Charging on Si(100)-(2x1): Consequences for Surface Diffusion and STM Imaging," *Phys. Rev. B* 67:035311(1-7).

Yokoyama et al. (Oct. 15, 1997) "Dimer Buckling Induced by Single-Dimer Vacancies on the Si(100) Surface Near $T_c$," *Phys. Rev. B* 56(16):10483-10487.

Zhanpeisov et al. (1996) "Quantum Chemical SINDO1 Study of Vanadium Pentoxide," *Catal. Lett.* 39:111-118.

\* cited by examiner

1. Provide Semiconductor

2. Implant Semiconductor with Dopants

3. Treat Semiconductor with Surface Modification Agent

4. Anneal Semiconductor at 1200-5000 °C/s

1. Provide Semiconductor

2. Treat Semiconductor with Surface Modification Agent

3. Implant Semiconductor with Dopants

4. Anneal Semiconductor at 1200-5000 °C/s

1. Provide Semiconductor

2. Treat Semiconductor with 1st Surface Modification Agent

3. Implant Semiconductor with Dopants

4. Treat Semiconductor with 2nd Surface Modification Agent

5. Anneal Semiconductor at 1200-5000 °C/s

1. Provide Semiconductor

2. Implant Semiconductor with Dopants

3. Treat Semiconductor with Surface Modification Agent

4. Form Solid Interface on Semiconductor Surface

5. Anneal Semiconductor

1. Provide Semiconductor

2. Form Solid Interface on Semiconductor Surface

3. Implant Semiconductor with Non-reactive compound

ΔT

4. Anneal Semiconductor

3. Implant Semiconductor with Dopants

ΔT

4. Anneal Semiconductor

PREPARATION OF ULTRA-SHALLOW SEMICONDUCTOR JUNCTIONS USING INTERMEDIATE TEMPERATURE RAMP RATES AND SOLID INTERFACES FOR DEFECT ENGINEERING

CROSS REFERENCE TO RELATED APPLICATION

This application claims priority under 35 U.S.C. §119(e) to U.S. Provisional Patent Application No. 61/037,882 filed on Mar. 19, 2008, which is hereby incorporated by reference in its entirety.

BACKGROUND OF THE INVENTION

This invention is in the field of semiconductor processing. This invention relates generally to techniques for preparation of ultra-shallow semiconductor junctions.

The continuing trend toward smaller, higher speed microelectronic devices requires integrated circuit designs characterized by smaller feature sizes and closer spacing between electrical components. These requirements have generated an immediate demand for methods for fabricating extremely shallow and spatially well defined dopant-containing semiconductor layers that exhibit very low electrical resistance in microelectronic devices. For example, current complementary metal oxide semiconductor (CMOS) transistors in integrated microelectronic circuits require source-drain junction depths of less than 100 nanometers, and it is predicted that a further decrease of source-drain junction depths by a factor of ten will be required to continue scaling of microelectronic device performance according to Moore's Law: the doubling of the density of transistors on a chip about every 18 months. The International Technology Roadmap for Semiconductors currently acknowledges, however, that there are no known manufacturing solutions to satisfy these rapidly evolving device requirements. Accordingly, fabrication of extremely shallow dopant-containing semiconductor layers having low electrical resistance, such as dopant-containing layers comprising P-N junctions in CMOS transistors, is a fundamental barrier to continued advances in the performance of many microelectronic devices.

The fabrication of integrated electronic circuits having reduced feature sizes requires methods for introducing conductivity-altering dopant materials into semiconductor substrates that provide control of electrically active dopant concentrations in both lateral and vertical dimensions. Semiconductor dopants, such as boron, arsenic or phosphorous atoms, may be introduced into semiconductor layers of microelectronic devices by thermal diffusion methods, or by ion implantation followed by annealing. For the fabrication of high density integrated electrical circuits, however, ion implantation techniques, particularly those employing low implantation energies, are generally preferred over thermal diffusion methods because ion implantation provides reproducible and precise control over the spatial distribution of dopants implanted into the bulk phase of a semiconductor substrate. Furthermore, thermal diffusion methods are susceptible to problems associated with lateral diffusion of dopants, poor control of dopant concentrations and a propensity to generate dislocations, which can significantly impede satisfaction of the feature size and spacing requirements of electrical components in dense integrated electrical circuits. As a result of these considerations, source-drain junctions in most high density integrated circuits are currently fabricated using ion implantation methods.

In conventional ion implantation methods, a selected semiconductor dopant material is ionized in an ion source and accelerated to form an ion beam having a selected distribution of energies. The ion beam is directed to an exposed surface of a semiconductor substrate, and the accelerated ions penetrate the exposed surface and enter the bulk phase. Ions lose energy via collisions with atoms in the semiconductor substrate, thereby eventually coming to rest and becoming embedded in the substrate. The concentration of dopant implanted in the substrate may be controlled by selection of the flux of the ion beam together with the total implantation time, and the dopant depth profile in the semiconductor substrate can be controlled to some extent by selection of the acceleration energy imparted to the ion beam. After implantation, the dopant-containing layer is annealed, often to temperatures over 1000 degrees Celsius, to electrically activate the dopant atoms by positioning them into substitutional sites in the lattice of the semiconductor substrate. In addition, annealing after implantation promotes repositioning of atoms comprising the semiconductor into lattice sites, thereby repairing disruptions of the semiconductor lattice caused by dopant implantation.

The depth of dopant material in a semiconductor substrate is largely determined by the implantation energies employed during ion implantation. Shallower dopant containing layers can be prepared using lower ion implantation energies. Subsequent annealing of the dopant-containing layer, however, inevitably causes dopant atoms to diffuse, which thereby increases the physical dimensions of the dopant-containing layer. Current annealing technologies have run into a limit in their ability to simultaneously increase dopant activation and decrease dopant diffusion, especially for the key dopant boron. This problem has been worsened by the need to continually reduce processing temperatures to avoid damaging structures already in place during device fabrication.

In "soak" annealing, a semiconductor wafer is held at constant temperature for several minutes. It is sometimes used for "solid phase epitaxial regrowth" (SPER), in which a doped layer of amorphous silicon is grown and then heated with a large crystalline seed layer underneath to guide the crystal formation of the doped layer. Much research has gone into SPER, though it does not appear to be the method the semiconductor industry is moving toward. In "spike" annealing, the temperature is ramped by incandescent light heating (after a temperature stabilization step of several tens of seconds at 600-800° C.) at 25-400° C./second up to typically about 1050° C. The dwell time near the top of the spike is 0.5-1 second, and is governed by the time it takes for the lamps to cool down after power is cut (due to radiant heat loss).

There are two kinds of millisecond heating methods that the industry is moving toward. One is "flash" annealing, wherein the wafer is brought to a baseline temperature of several hundred degrees by conventional incandescent light, and then exposed to a pulse of light from a bank of flashlamps that are on for about 1 millisecond. Only a thin skin of Si near the surface of the wafer is directly heated, but the skin is thick enough to encompass the devices on the surface. After the lamps go off, rapid heat conduction from the skin into the underlying wafer rapidly cools the skin region back down on a millisecond time scale. To some extent, the heating rate can be varied by changing the timing of the electrical discharge that powers the flash. In "laser spike annealing" (LSA), a high-power continuous-wave laser is rastered across the wafer surface. The heating rate is set by the scan speed.

Both flash and laser annealing can be employed in various combinations with spike annealing, mainly because it is found empirically that the millisecond techniques do a comparatively poor job of removing implantation damage, which leads to harmful leakage currents in the final device. Up to now there has been little rational design for these recipes because the mechanisms by which millisecond annealing techniques achieve their improvements in dopant activation and diffusion (compared to spike annealing) were unknown. There have also been problems with metastability of the activated dopant in millisecond annealing; subsequent thermal steps tend to decrease the degree of dopant activation.

Dopant diffusion behavior is largely determined by a complex interplay between lone interstitials of both dopant and semiconductors, and by interstitial clusters containing various mixtures of dopant and semiconductors that render the lone interstitials immobile. Vacancies also play a role to some extent. During implantation, numerous lone interstitials are created that diffuse quickly. Some interstitials annihilate vacancies, but because the extra atoms introduced by implantation cause the interstitials to outnumber vacancies, the remaining interstitials accrete into clusters. Subsequent annealing dissociates these clusters releasing both semiconductor and dopant interstitials. Some dopant atoms enter lattice sites and become electrically activated by participating in "kick in" substitution reactions that displace atoms of the host semiconductor. However, semiconductor interstitials may reverse this process by participating in efficient "kick out" substitution reactions that convert immobilized, electrically active dopant atoms in substitutional atomic sites into highly mobile, electrically inactive dopant atoms. Such enhanced diffusion attributed to processes promoted by interstitial point defects generated during implantation or thermal processing comprise the primary portion of what are commonly referred to as transient enhanced diffusion (TED) mechanisms. These complex diffusion mechanisms constitute a fundamental limit on the control of physical dimensions of dopant-containing layers prepared by ion implantation methods and currently impede reproducible fabrication of ultra-shallow (<200 nm) dopant-containing layers.

The undesirable effects of TED are exacerbated by the higher concentrations of active dopant required for improved microelectronic device performance. Such high concentrations are well above the thermodynamic solubility limit and, thus the corresponding structures are thermodynamically unstable. Ion implantation at the high ion fluxes required to achieve such dopant concentrations creates a large number of defects and interstitials in the bulk phase of the semiconductor substrate which promotes fast TED of the dopants during annealing. These TED mechanisms involving interstitials ultimately results in significant junction deepening. In addition, implantation at high ion fluxes may generate electrically charged defect sites residing at the exposed surface of the semiconductor layer in sufficient numbers that they couple to the motion of charge defects in the underlying bulk. As bulk defects mediate diffusion of dopants in the bulk phase, such surface electrical charges can induce a corresponding change in the dopant concentration depth profile, generally deepening it. Accordingly, while ion implantation provides some degree of control of electrically active dopant concentrations and concentration depth profiles in semiconductor substrates, additional means of controlling dopant diffusion during annealing is greatly needed to reduce structure sizes and to provide improved precision of dopant depth profiles (in both vertical and lateral directions) necessary for the development of the next generation of higher performing integrated electronic devices.

A number of approaches for reducing TED in implanted semiconductor substrates have been developed over the last decade to enable fabrication of very shallow dopant-containing semiconductor layers, such as P-N junctions in CMOS transistors. Substantial research has been directed at developing methods of engineering various kinds of defects in the bulk phase of semiconductor substrates which provide an effective sink for semiconductor interstitials. These methods include the use of foreign atoms, such as carbon or halogens, dislocation loops, and co-implantation with high energy ions. Such defect engineering methods, however, have generally demonstrated limited utility. Other approaches to reducing TED in implanted semiconductor substrates include laser annealing and deposition methods for growing ultra thin dopant-containing junctions. While these methods may effectively limit the occurrence of TED, implementation of these methods is expected to require solutions to a large number of problems associated with integration of these methods into existing and well developed semiconductor processing techniques. Such integration issues remain a significant barrier to adoption of these approaches for fabricating ultra-shallow dopant-containing semiconductor layers.

SUMMARY OF THE INVENTION

Described herein are methods for fabricating ultra-shallow semiconductor junctions. In one aspect, a method employs modification of the semiconductor surfaces in conjunction with moderate temperature ramp-up rate annealing (e.g., 1200-5000° C./second) to prepare highly doped and activated semiconductor structures having junction depths as small as 5 nm. In another aspect, methods for fabricating semiconductor junctions having ultra-shallow depths use solid-solid interfaces and surface modification for control of dopant activation and diffusion.

The methods described herein allow for fabrication of semiconductor junctions having depths from 5 to 100 nm. In one aspect, methods are provided for making a doped semiconductor; a method of this aspect comprises the steps of providing a semiconductor, implanting the semiconductor with dopants, treating the semiconductor with a surface modification agent, and annealing the semiconductor using a temperature ramp-up rate selected from 100 to 5000° C./second. In an embodiment, a preferred temperature ramp-up rate useful for this aspect is selected from the 2000 to 3500° C./second, and, even more preferably, the temperature ramp-up rate is 3000° C./second. In another embodiment, a method of this aspect further comprises the step of controlling the temperature ramp-down rate of the semiconductor after annealing. In a preferred embodiment, temperature ramp-down rate is selected from 100 to 5000° C./second; even more preferably, the temperature ramp-down rate has the same magnitude as the temperature-ramp up rate. For some embodiments, the temperature ramp rates are constant; for other embodiments, the temperature ramp-rates change as a function of time during annealing. In an embodiment, a plurality of temperature ramp rates are utilized during annealing, wherein at least one temperature ramp rate is selected over the range of 100 to 5000° C./second, in some embodiments selected over the range of 1500 to 4500° C./second, and in some embodiments selected over the range of 2000 to 3500° C./second.

In an embodiment, the steps of the methods of this aspect can be performed in any order; preferably, the step of implanting the semiconductor with dopants occurs before the step of annealing the semiconductor. For example, the step of treating the semiconductor with a surface modification agent can occur before or after the step of implanting the semiconductor with dopants. The methods of this aspect also include methods wherein the semiconductor surface is treated with a surface modification agent both before and after implantation with dopants.

Additional steps can be performed on the semiconductor before or after any of the steps of the methods of this aspect. For example, a photoresist or other substances or structures can be deposited onto the surface of the semiconductor before, after, or between any steps of the methods of this aspect. Additionally, the steps of the methods of this aspect may be combined. For example, the step of providing a semiconductor and implanting the semiconductor with dopants may be combined in a step of providing a semiconductor having implanted dopants.

During annealing, the methods of embodiments described herein raise the temperature of the semiconductor. In one embodiment, the temperature of a surface of the semiconductor is raised to a peak temperature selected from the range of 600 to 1500° C. In a preferred embodiment, the temperature of a surface of the semiconductor is raised to a peak temperature selected from the range of 1200 to 1410° C., and even more preferably to a peak temperature just below the melting point of the semiconductor (e.g. about 1400° C. for silicon). In an embodiment, the peak temperature selected is dependent upon the semiconductor composition; for example, peak temperatures up to about 2700° C. may be used for semiconductors having high melting points, such as SiC. In a preferred embodiment, the temperature ramp rate-up and peak temperature are simultaneously selected. In an embodiment, peak temperatures of 100 to 800° C. are useful with the methods described herein for solid phase epitaxial regrowth. For some embodiments, the time during which a selected temperature ramp-rate is utilized is selected so as to achieve a specific and/or preselected peak temperature. In an embodiment, for example, the time during which a selected temperature ramp-rate is utilized is selected over the range of 0.1 μs to 10 s.

Annealing methods known in the art of semiconductor fabrication capable of providing temperature ramp-up rates of 100 to 5000° C./second are useful with the methods described herein. For example, U.S. Pat. No. 6,762,136 discloses an annealing method capable of providing temperature heating and cooling rates greater than 1000° C./second to greater than 10000° C./second. Preferred annealing methods comprises methods where the temperature ramp-up rate can be precisely selected and/or controlled; for example, laser flash annealing methods can be used to select a precise annealing temperature ramp-up rate by selecting the power of the laser, the rate at which the laser is scanned across the semiconductor, or both.

For certain embodiments of the methods described herein, it is desirable to control the time the semiconductor spends at or near the peak temperature. In one embodiment, the annealing step raises the temperature of the surface of the semiconductor to a temperature within 50° C. of the peak temperature for a total time of less than 50 ms. In another embodiment, the temperature of the surface of the semiconductor is within 50° C. of the peak temperature for a longer time, for example a time of 60 minutes. The time the semiconductor may spend within 50° C. of the peak temperature can be selected, for example, from times ranging from 0.1 ms to 90 minutes.

For some embodiments, the methods include the step of treating the semiconductor with a surface modification agent. In an embodiment, treatment of the semiconductor with a surface modification agent generates an atomically clean semiconductor surface. In another embodiment, treatment with a surface modification agent results in at least a portion of the semiconductor surface being atomically clean.

In another embodiment, treatment with a surface modification agent results in at least a portion of the semiconductor surface having dangling bonds. Other methods aside from treatment with a surface modification agent may also be used for generation of an atomically clean or undersaturated semiconductor surface or a semiconductor surface having dangling bonds. For specific embodiments, the treatment with a surface modification agent occurs before any step annealing the semiconductor having implanted dopants. For some of these embodiments, the treatment step allows for control over the rates and extent of dopant diffusion during a subsequent annealing step.

Surface modifying agents useful in the methods described herein are also capable of interacting with semiconductor surfaces in a manner generating diffusion control groups or surface modification groups on an exposed semiconductor surface, preferably a selected surface abundance or population of diffusion control groups on an exposed semiconductor surface. Diffusion control groups can selectively increase or decrease the loss rate of semiconductor interstitial with the semiconductor surface. For some embodiments, the surface abundance of diffusion control groups is controlled by selection of the composition of one or more of the surface modifying agents exposed to the semiconductor surface, the exposure time, the temperature of the semiconductor surface during exposure, concentrations or partial pressures of one or more surface modifying agents exposed to the semiconductor surface, the total pressure of the system during exposure or any combination of these parameters. In one embodiment, the surface abundance of diffusion control groups is selected from the range of about $1 \times 10^{12}$ molecules cm$^{-2}$ to about $2 \times 10^{15}$ molecules cm$^{-2}$, more preferably for some applications $4 \times 10^{14}$ molecules cm$^{-2}$ to about $9 \times 10^{14}$ molecules cm$^{-2}$. Alternatively, the surface abundance of diffusion control groups is selected from the range of about 0 to about 3 monolayers, and more preferably for some applications 0.001 monolayers to about 1.5 monolayers. U.S. patent application Ser. No. 11/192,339 (U.S. Patent Application Publication No. 2006/0024928), the disclosure of which is herein incorporated by reference in its entirety, discloses methods of treating a semiconductor with surface modification agents for control of dopant diffusion and activation. In specific embodiments, the amount and/or surface abundance of diffusion control groups present on the surface allows for selection and/or control of the surface annihilation probability for interstitial atoms, the interface annihilation probability for interstitial atoms. In embodiments, the amount and/or surface abundance of diffusion control groups present on the surface allows for selection and/or control over the rates and/or extents of dopant diffusion which occur during annealing, thereby achieving a selected dopant profile.

Interaction of surface modifying agents and an exposed semiconductor surface may generate diffusion control groups comprising chemically adsorbed species, physically adsorbed species or a combination of chemically adsorbed species and physically adsorbed species on a semiconductor surface. Alternatively, surface modifying agents may chemically react with an exposed semiconductor surface, thereby generating functional groups covalently bound to the semiconductor surface. Surface modifying agents useful in the methods include nitrogen-containing compounds, carbon-containing compounds, oxygen-containing compounds, plasmas, hydrogen-containing compounds, halogen-containing compounds, hydrogen donating compounds, oxygen donating compounds, nitrogen donating compounds, or halogen donating compounds. Surface modifying agents useful for some aspects comprise a gas or a mixture of gases.

For specific embodiments, the methods further comprise a step of terminating the treatment with a surface modification agent when a desired surface abundance of diffusion control groups or surface modification groups is reached. For certain embodiments, the surface abundance of diffusion control groups does not reach a level greater than the desired surface abundance. For example, when a surface abundance of diffusion control groups has a desired surface abundance selected between 0.1 and 3 monolayers, the surface abundance does not reach a level greater than the surface abundance selected between 0.1 and 3 monolayers.

Diffusion control groups or surface modification groups affect the chemical properties, electrical properties and/or physical properties of semiconductor surfaces, such as the surface composition, chemical reactivity, the number, charge, and/or surface abundance of free, dangling bonds, surface electrical charge or any combination of these. Diffusion control groups preferred for some applications are highly stable on a semiconductor surface, for example groups that are bound to the surface by covalent bonds, such as single and double silicon and nitrogen bonds and nitride bonds, and/or molecules or groups of molecules that are bound to the surface by strong electrostatic forces provided by intermolecular forces, hydrogen bonds, dipole-dipole interactions, van der Waals forces or any combination of these. Diffusion control groups may be present on semiconductor surfaces in less than monolayer amounts or may be present in monolayer or multilayer amounts. Use of diffusion control groups that strongly bind to a semiconductor surface is beneficial because these groups are stable at elevated temperatures, such as temperatures ranging from about 400 to about 1500° C., and therefore, do not appreciably degrade, sublimate or evaporate at the annealing temperatures and protocols of the methods described herein. In an embodiment, a diffusion control group desorbs or is removed from the surface at a specific temperature; diffusion control groups which are eliminated from the surface at specific temperatures allow for even finer control of the rates of dopant diffusion and activation.

In another embodiment, a method of this aspect further comprises the step of forming a solid interface on the surface of said semiconductor. In a preferred embodiment, the step of forming a solid interface on the surface of the semiconductor occurs after the step of treating the semiconductor with a surface modification agent. The methods of this aspect also include methods wherein the semiconductor surface is treated with a surface modification agent both before and after formation of the solid interface on the surface of the semiconductor. In some embodiments, the solid interface is formed on the surface of the semiconductor before implantation with dopants. In yet other embodiments, the solid interface is formed on the surface of the semiconductor before treatment with a surface modification agent. Additionally, the steps of implanting the semiconductor with dopants and forming a solid interface on the surface of the semiconductor and may be combined in a step of forming a solid interface on the surface of the semiconductor while implanting the semiconductor with dopants.

One embodiment further comprises the step of implanting the semiconductor with a non-reactive and/or a reactive compound, for example, implantation of a noble gas, a semiconductor, a fluorine containing compound, a nitrogen containing compound, a phosphorus containing compound or an oxygen containing compound. In an embodiment, the implantation with a non-reactive or reactive compound affects the charge, number and/or abundance of free and/or dangling bonds and/or of surface modification or diffusion control groups. In an embodiment, implantation with a non-reactive compound amorphizes at least a portion of the semiconductor. A specific embodiment includes implantation of semiconductor surfaces with non-reactive or reactive compounds; that is, semiconductor surfaces which have no solid interface present. A specific embodiment of this aspect includes and implantation of semiconductors having a solid interface present with non-reactive or reactive compound. In an embodiment, a reactive or non-reactive compound is implanted at a preselected dose, fluence and/or implantation energy so as to achieve a preselected dopant profile, a preselected annihilation probability and/or preselected rates and/or extents of dopant diffusion during annealing. For some embodiments, treatment with a surface modifying agent and implantation with a reactive or non-reactive compound results in a synergy, allowing for greater control over the extent of dopant diffusion, over dopant concentration profiles, and/or over interstitial annihilation rates. Without wishing to be bound by any theory, it is believed that implantation with a non-reactive and/or a reactive compound produces defects within the semiconductor which modify the surface and/or interface annihilation probability of interstitial atoms.

In an embodiment, useful solid interfaces comprise the interface between the surface of the semiconductor and a layer of a solid disposed thereon. In a preferred embodiment, the solid layer is grown or deposited on the surface of the semiconductor. In an embodiment, the solid layer is formed on the surface of the semiconductor by methods generally known in the art of semiconductor fabrication. Useful solids comprise material selected from the group consisting of dielectric layers, oxides, nitrides, and silicates. In an embodiment, the oxides, nitrides, and silicates are those of the underlying semiconductor. In another embodiment, the oxides, nitrides, and silicates are those of a metallic element, such as hafnium, zirconium, or titanium.

In specific embodiments, the treatment with a surface modification agent occurs after formation of a solid interface and/or after formation of a solid layer on the surface of the semiconductor. For some embodiments, the surface modification agent is a gas, for example a gas which diffuses through the solid layer. After treatment, in some embodiments, the surface modification agent is not substantially present in the solid layer and/or does not modify the solid layer. In some embodiments, the treatment with a surface modification agent forms diffusion control groups at the solid interface without modifying the solid layer.

In a preferred embodiment, the solid layer disposed on the surface of the semiconductor has a thickness selected from 0.5 to 100 nm; in another embodiment, the solid layer has a thickness more than 100 nm. The solid layer may cover the entire semiconductor surface, or may optionally only cover a portion of the semiconductor surface. In a preferred embodiment, the solid layer is not uniform across the surface of the semiconductor; that is, there may be regions where the solid layer is thicker than the average solid layer thickness and there may be regions where the solid layer is thinner than the average solid layer thickness. In a preferred embodiment, the solid interface acts as a sink for interstitial semiconductor atoms.

In another embodiment, the solid layer or the semiconductor is patterned with one or more relief features, channels, depressions, vias, plug holes, trenches, raised source-drain structures, or any combination of these. These features may be those of planar transistor technologies or multiple independent gate field effect transistors such as FinFETs.

The annealing steps of the methods described herein are useful for activating the implanted dopants and/or repairing any damage to the semiconductor generated during dopant implantation or implantation of a non-reactive compound. In an embodiment, the methods of embodiments described herein form semiconductor junctions having a concentration of activated dopants selected from $10^{18}$ to $5\times10^{21}$ dopants/cm$^3$.

In another aspect, methods are provided for making an ultra-shallow semiconductor junction. A method of this aspect comprises the steps of providing a semiconductor, implanting the semiconductor with dopants, annealing the semiconductor using a temperature ramp rate-up selected from 100 to 5000° C./second, thereby making an ultra-shallow semiconductor junction, wherein the semiconductor junction has a junction depth selected from 5-100 nm. In an embodiment, the step of annealing raises the temperature of the surface of the semiconductor to a peak temperature selected from the range of 600 to 1500° C.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

BRIEF DESCRIPTION OF THE DRAWINGS AND TABLES

Figure 4:
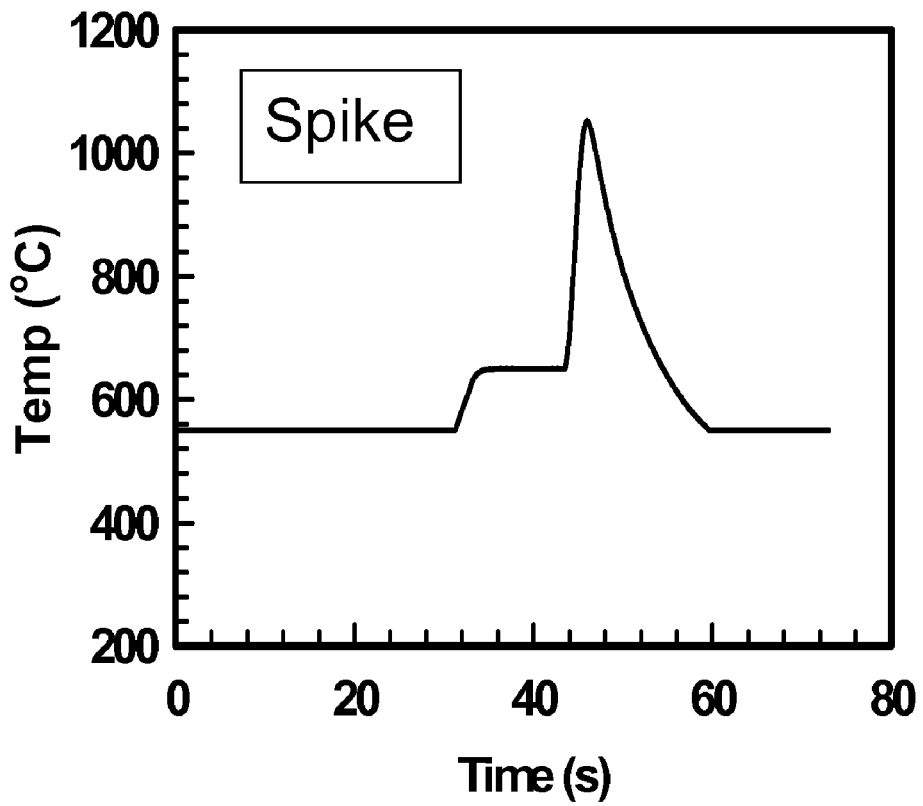
Figure 4:
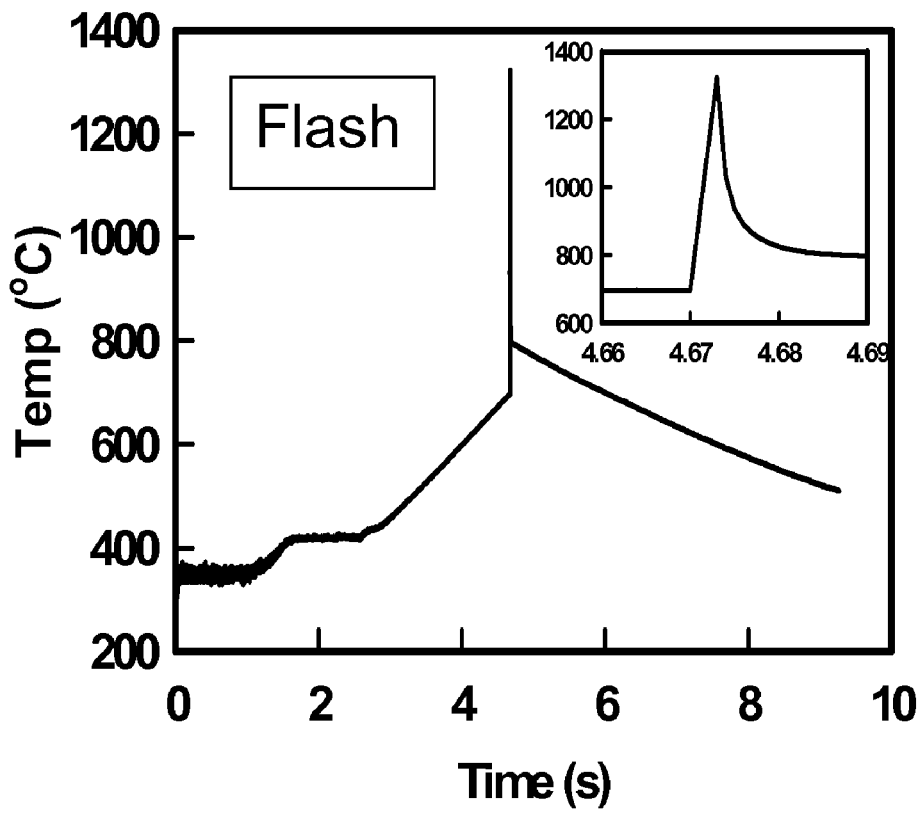

FIG. 4 provides semiconductor temperature profiles for spike and flash annealing methods.

Figure 5A:
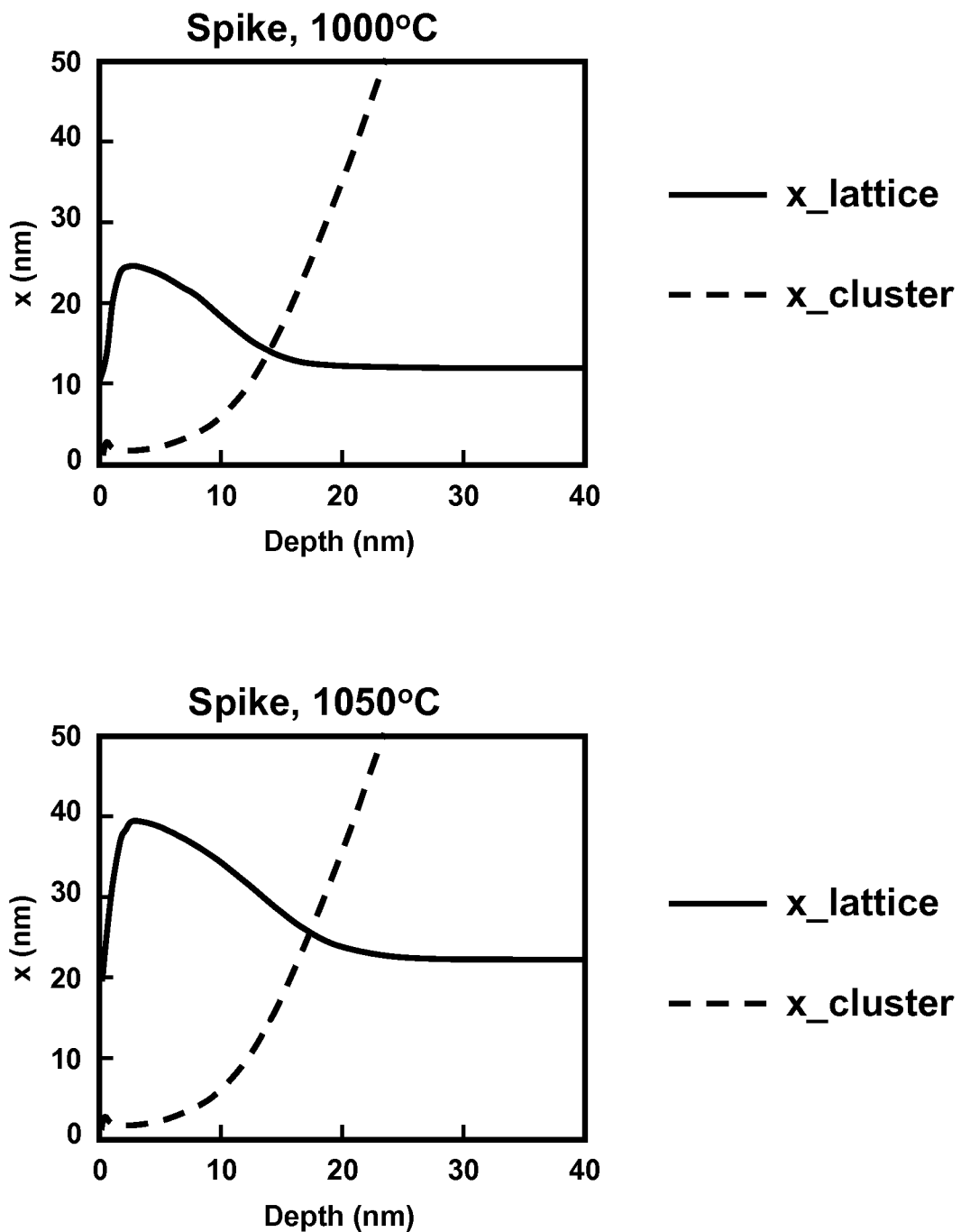

FIG. 5A provides data showing which boron immobilization method dominates under two different spike annealing conditions.

Figure 5B:
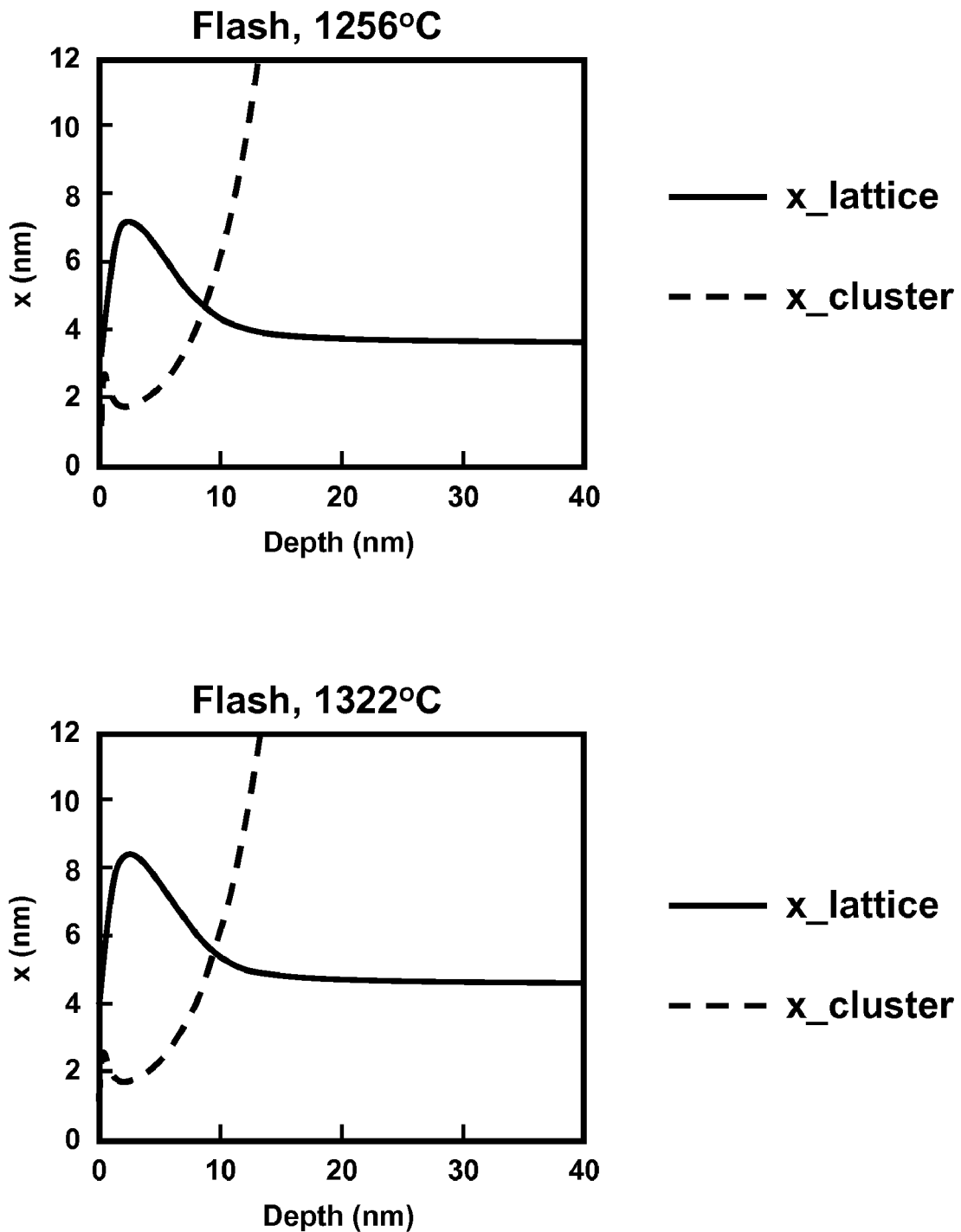
Figure 6:
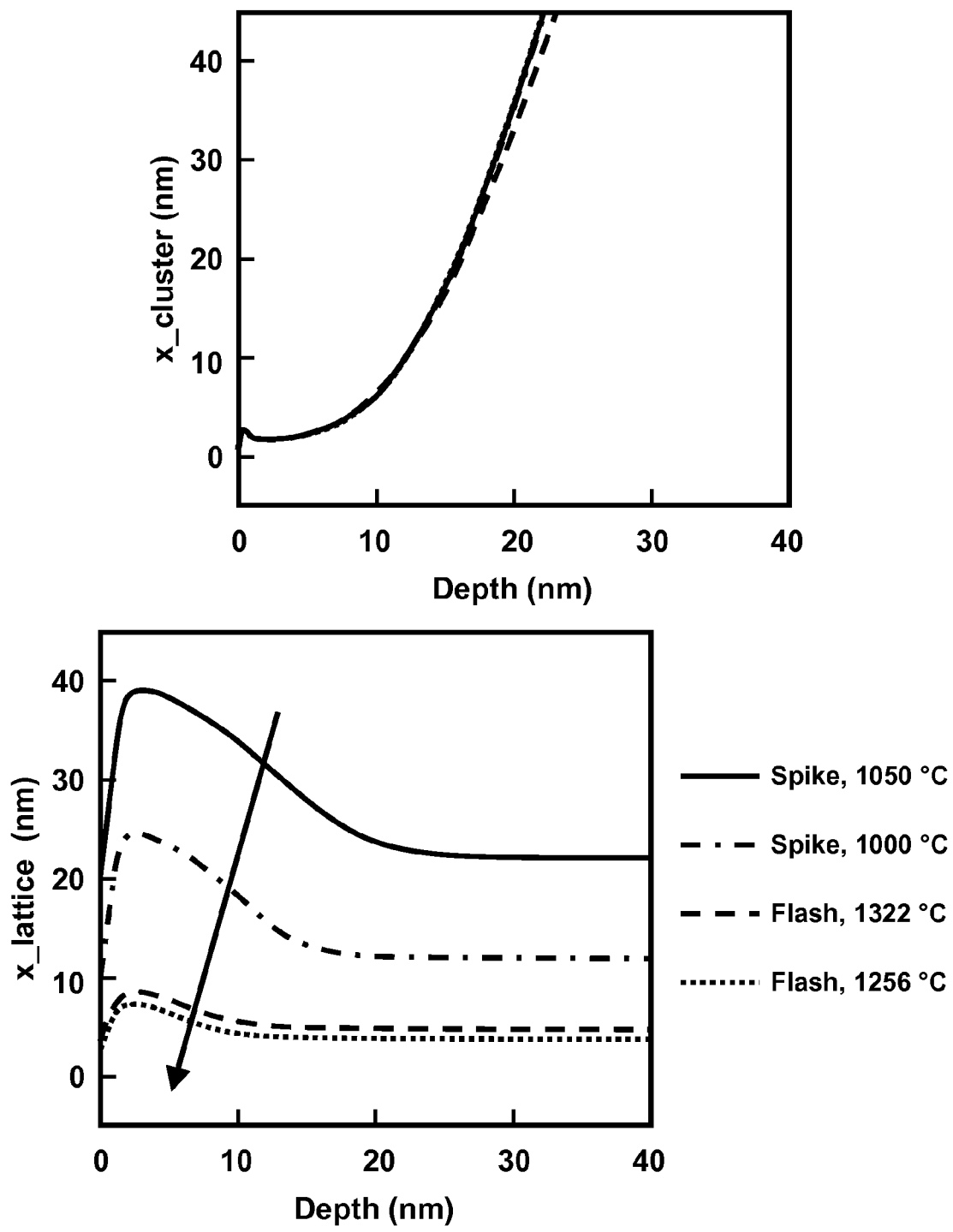

FIG. 5B provides data showing which boron immobilization method dominates under two different flash annealing conditions FIG. 6 provides data showing the effects of different temperature ramp rates on boron diffusion.

Figure 7:
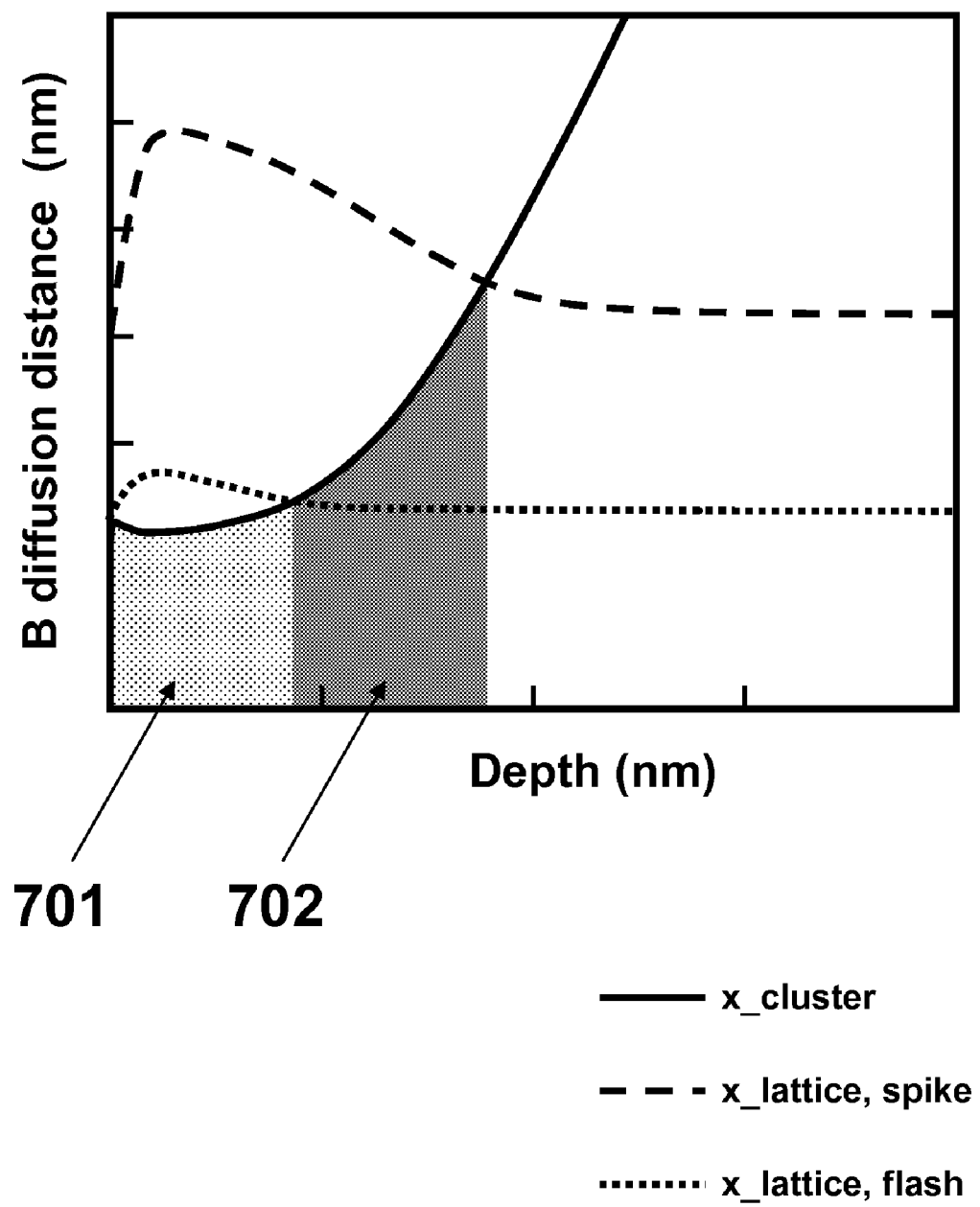

FIG. 7 provides a summary of the mechanism by which boron immobilization occurs under different conditions.

Figure 8A:
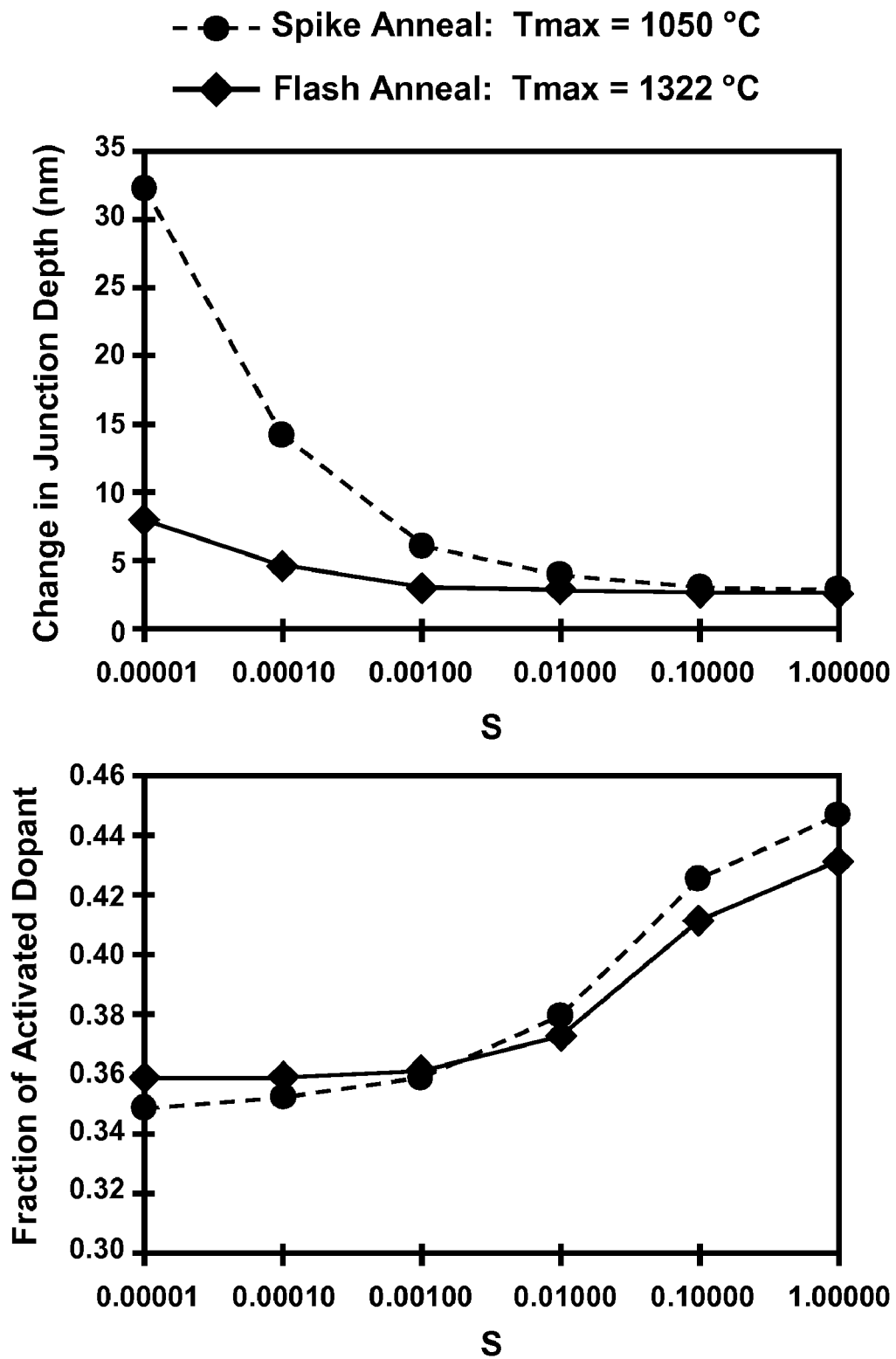
Figure 8B:
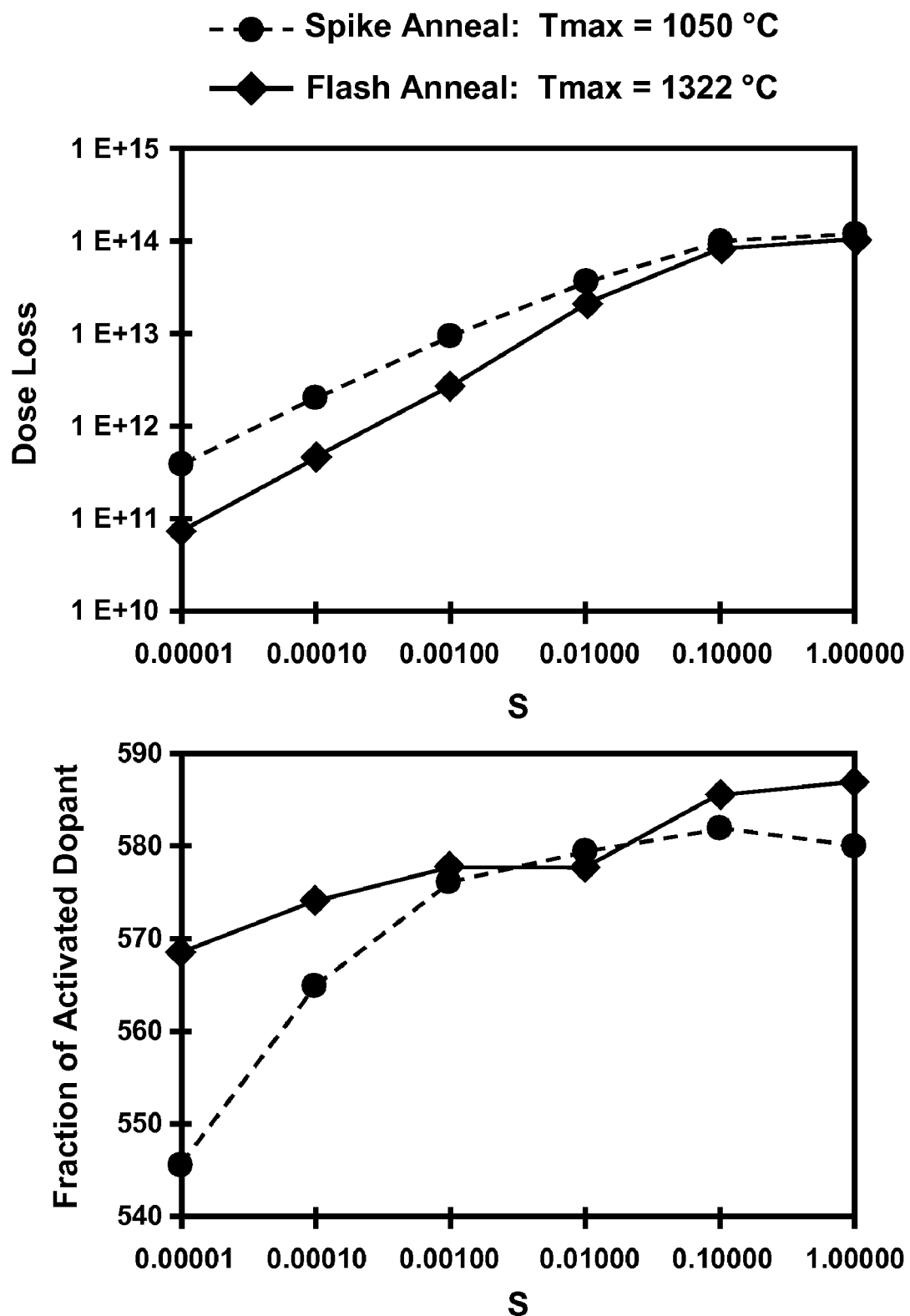

FIGS. 8A and 8B provide simulation data illustrating semiconductor junction properties as a function of the surface loss probability for spike and flash annealing conditions.

Table 1 provides a comparison between spike annealing, flash annealing, optimized spike annealing, and an optimized ramp-rate annealing.

Table 2 provides simulation results showing the maximum cluster dissociation energy achieved by spike and flash annealing for different peak temperatures.

Table 3 summarizes the effect of ramp-rate on cluster dissociation.

Table 4 summarizes the effect of ramp-rate on junction depth.

Figure 9A:
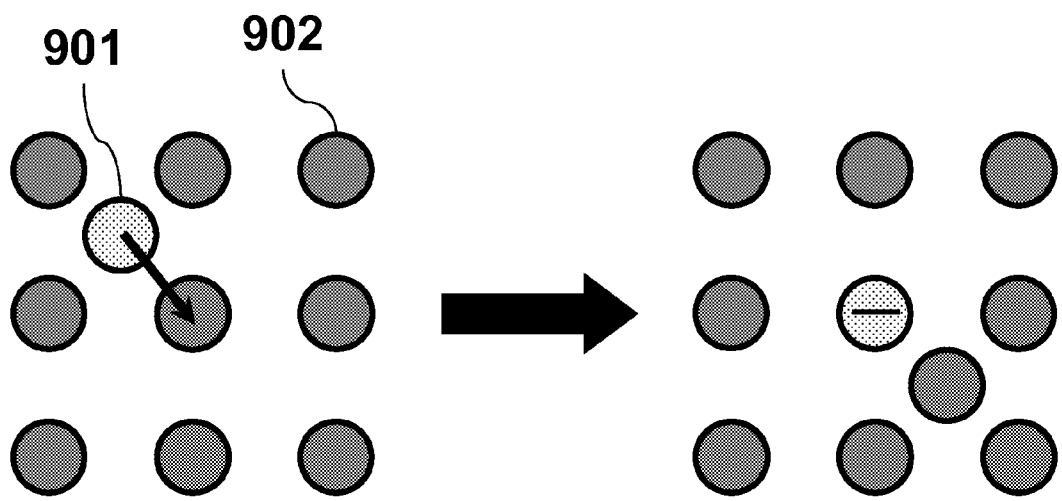
Figure 9B:
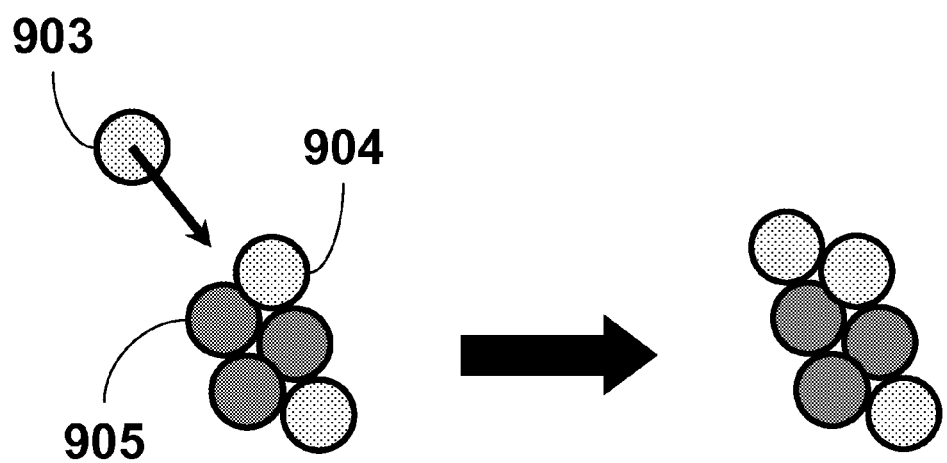

FIGS. 9A and 9B illustrate mechanisms for dopant immobilization.

Figure 10:
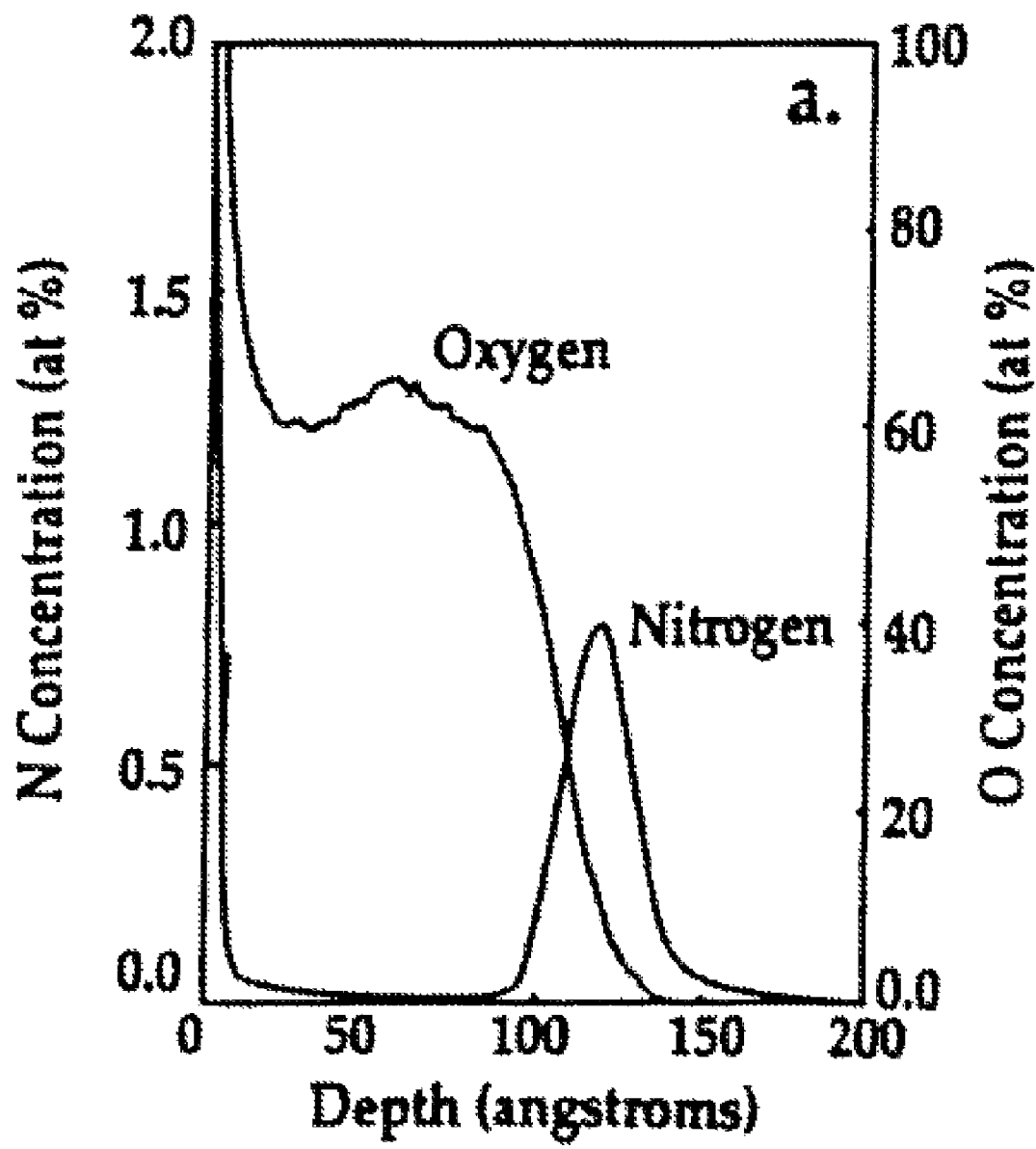

FIG. 10 illustrates N and O concentration profiles for a silicon oxide film annealed in NO.

Figure 11A:
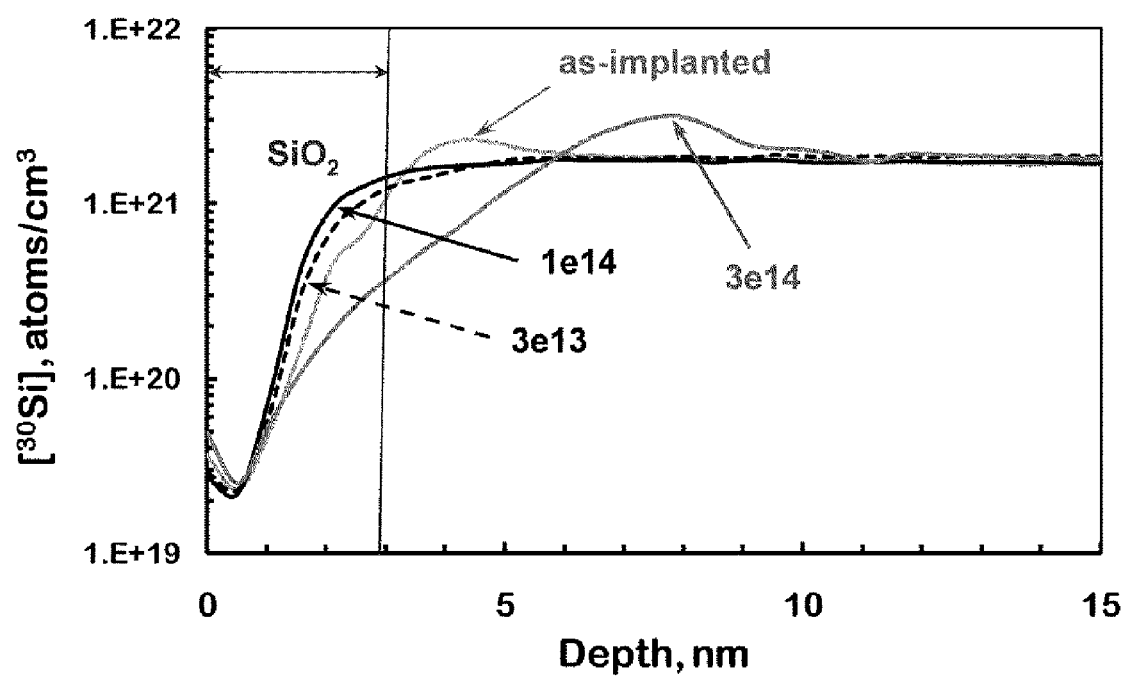
Figure 11B:
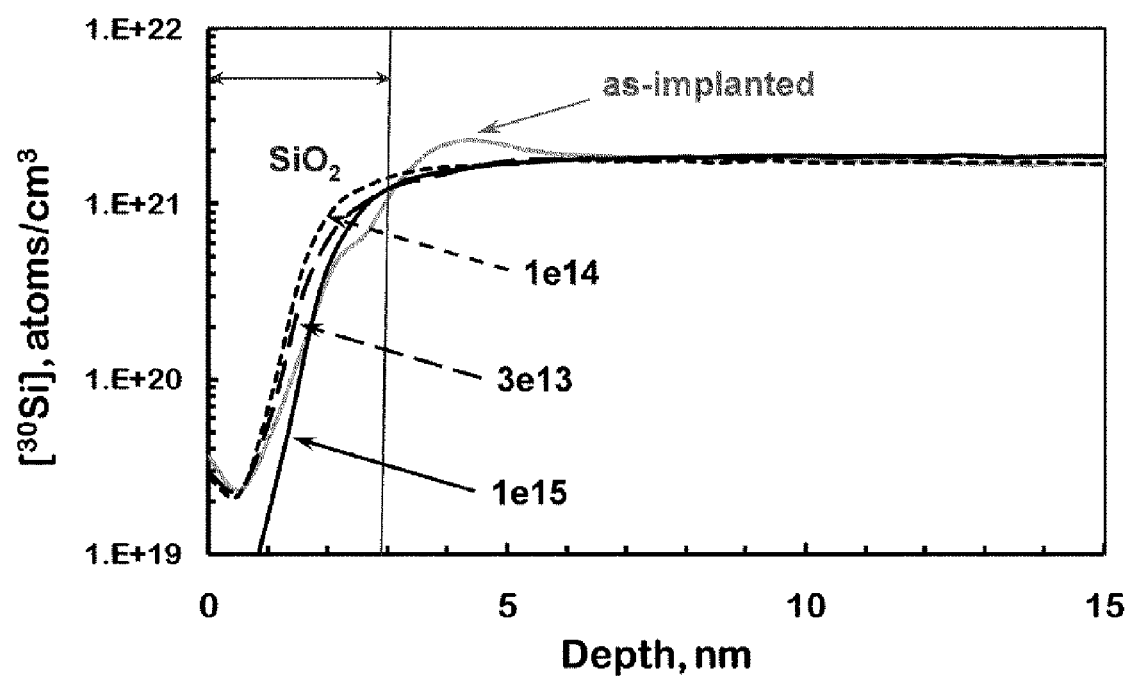

FIGS. 11A and 11B illustrate $^{30}$Si concentration profiles for crystalline silicon samples implanted with $^{30}$Si, oxidized, implanted with Ar and annealed.

DETAILED DESCRIPTION OF THE INVENTION

In general the terms and phrases used herein have their art-recognized meaning, which can be found by reference to standard texts, journal references and contexts known to those skilled in the art. The following definitions are provided to clarify their specific use in the context of the invention.

"Semiconductor" refers to any material that is an insulator at a very low temperature, but which has an appreciable electrical conductivity at a temperature of about 300 Kelvin. In the present description, use of the term semiconductor is intended to be consistent with use of this term in the art of electronic device fabrication and processing. Semiconductors useful with embodiments described herein include elemental semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. Other useful semiconductors include solid solutions with continuously variable composition such as $Si_xGe_{1-x}$ or $Ga_xIn_{1-x}As_yP_{1-y}$. The term semiconductor includes intrinsic semiconductors and extrinsic semiconductors that are doped with one or more selected materials, including semiconductors having p-type doping materials and n-type doping materials. The term semiconductor includes composite materials comprising a mixture of semiconductors.

"Dopant" refers to ions, atoms, compounds, or any aggregates or combinations of these that are introduced into a material, usually in small quantities, to affect the material's chemical, electrical or other physical properties. As used herein dopants include, atoms, compounds, or any aggregates or combinations of these that are introduced in a semiconductor to affect the semiconductor's electrical characteristics, such as the semiconductor's electrical conductivity and resistance. Useful dopants include p-type dopants such as boron, n-type dopants such as phosphorous, antimony and arsenic, and combinations of n-type dopants and p-type dopants. Other materials, such as beryllium, may also be used as dopants.

"Interstitial" refers to an atom, ion and/or molecule that does not reside in the lattice sites or substituted lattice sites of a material, such as a single crystalline or polycrystalline semiconductor. Interstitial also may refer to a cluster of atoms, ions, molecules or any combination of these that does not reside in the lattice sites or substituted lattice sites of a material. Interstitials may comprise semiconductor atoms or clusters of semiconductor atoms which are not located in the lattice sites of a semiconductor and/or dopant atoms or clusters of dopant atoms that are not located in the substituted lattice sites of a semiconductor and/or clusters of dopant and semiconductor atoms that are not located in the substituted lattice sites of a semiconductor.

"Ultra-shallow" refers to the spatial dimensions, such as thickness, of a doped semiconductor structure, layer or region, such as a junction. In one embodiment, ultra-shallow refers to a doped semiconductor structure having a thickness less than or equal to about 100 nanometers, preferably for some applications less than or equal to about 5 nanometers.

"Surface modification agent" refers to compounds, atoms, ions or any aggregates or mixtures of these that are capable of interacting with semiconductor surfaces in a manner generating diffusion control groups on an exposed semiconductor surface. Surface modifying agents useful in the methods include, but are not limited to, hydrogen donating compounds, such as liquid HF and gaseous $H_2$; nitrogen-containing compounds, such as $N_2$, $NH_3$, $N_2H_4$, $HN_3$, $NO$, $N_2O$, $NO_2$, $N_2O_5$, $CH_3N_2CH_3$, $(CH_3)_2NNH_2$, an amine, HCN, and a nitrile; nitrogen donating compounds such as $NH_3$, $NO$, $N_2O$ and $N_2H_2$; carbon-containing compounds, such as a hydrocarbon, CO, an alcohol, an organic acid, an aldehyde, and an ester; oxygen containing compounds, such as $O_2$, $H_2O$, $H_2O_2$, and $O_3$; oxygen donating compounds such as $O_2$ and $NO_2$; and plasmas such as an $N_2$ plasma and an $O_2$ plasma. Useful surface modifying agents also include halogens and halogen donating compounds, such as $Cl_2$, $Br_2$, $F_2$, HCl, HBr, and HF. In addition, useful surface modifying agents include Ga, Sb or As containing compounds such as $SbH_3$, $AsH_3$, or organometallics of these materials such as trimethylgallium, trimethylarsine or triethylarsine. Surface modifying agents useful for some embodiments comprise a gas or a mixture of gases, for example a gas that releases nitrogen to a semiconductor surface. In one embodiment, surface modification agents undergo chemical reactions with a semiconductor surface to form diffusion control groups. Alternatively, surface modification agents may interact with a semiconductor surface in a manner generating diffusion control groups comprising chemiadsorbed and/or physiadsorbed materials, such as atoms, ions and molecules.

"Diffusion control group" or "surface modification group" interchangeably refer to materials residing at a semiconductor surface that affect the chemical properties, electrical properties and/or physical properties of semiconductor surfaces, such as the surface composition, chemical reactivity, the number, charge, and/or surface abundance of free, dangling bonds, surface electrical charge or any combination of these. Diffusion control groups preferred for some applications are highly stable on a semiconductor surface, for example groups that are bound to the surface by covalent bonds, such as single and double silicon and nitrogen bonds and nitride bonds, and/or groups that are bound to the surface by electrostatic forces such as intermolecular forces, hydrogen bonds, dipole-dipole interactions, van der Waals forces or any combination of these. Diffusion control groups may be present on semiconductor surfaces in less than monolayer amounts or may be present in monolayer or multilayer amounts. Diffusion control groups may be chemically adsorbed species such as chemiadsorbed N, physically adsorbed species such as physiadsorbed N, functional groups such as nitride groups, functional groups having silicon-nitrogen single bonds or functional groups having silicon-nitrogen double bonds, or any combination of these.

"Solid layer" refers to a layer of solid material deposited, grown, formed, or otherwise disposed on the surface of a semiconductor. A preferred solid layer modifies the affinity of the surface of the semiconductor or interface between the semiconductor and the solid layer for interstitial atoms. Useful solid layers include layers having any thickness, preferably thicknesses selected from 0.5-500 nm. Solid layers may comprise organic or inorganic material. Preferred solid layers include dielectric layers. Exemplary solid layers comprise materials including, but not limited to, oxides, nitrides, or silicates of the underlying semiconductor or of a metal, such as hafnium, zirconium, or titanium. Solid layers may be deposited, grown, or formed on the surface of a semiconductor by techniques known in the art of semiconductor device fabrication.

Described herein are processing conditions, techniques, and methods for preparation of ultra-shallow semiconductor junctions. Under some conditions, semiconductor annealing conditions useful in methods described herein (e.g. temperature ramp-up rates between 100 and 5000° C./second) nominally result in large activation percentages for implanted dopants but have a down side of extended dopant diffusion and therefore result in the production of semiconductor junctions having larger dimensions. Some method embodiments, however, utilize semiconductor surface processing or modification to limit the extent of dopant diffusion during annealing. These processing techniques allow for production of ultra-shallow junctions having high dopant activation under annealing conditions previously thought impractical. Also described herein are techniques for preparation of ultra-shallow semiconductor junctions utilizing the presence of a solid interface for control of dopant diffusion and activation.

Figure 1A:
FIG. 1a illustrates an exemplary method for making a doped semiconductor structure.
Figure 1A:
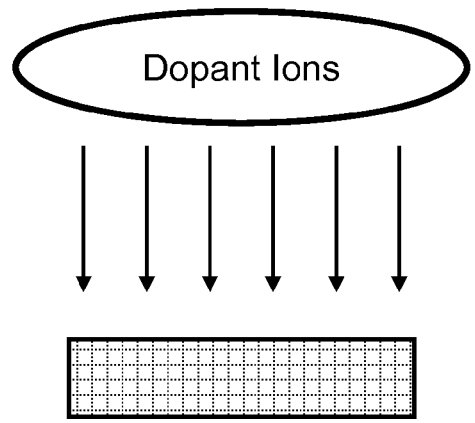
Figure 1A:
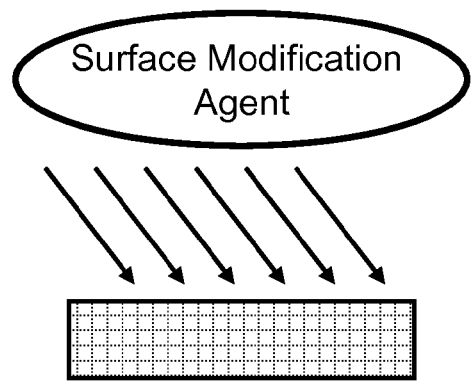
Figure 1A:

FIG. 1a illustrates an exemplary embodiment of a method for preparation of a doped semiconductor structure. In this method, a semiconductor is implanted with dopants, followed by treatment with a surface modification agent. Finally, the semiconductor is annealed under conditions where the temperature is ramped-up at a rate between 100 and 5000° C./second.

Figure 1B:
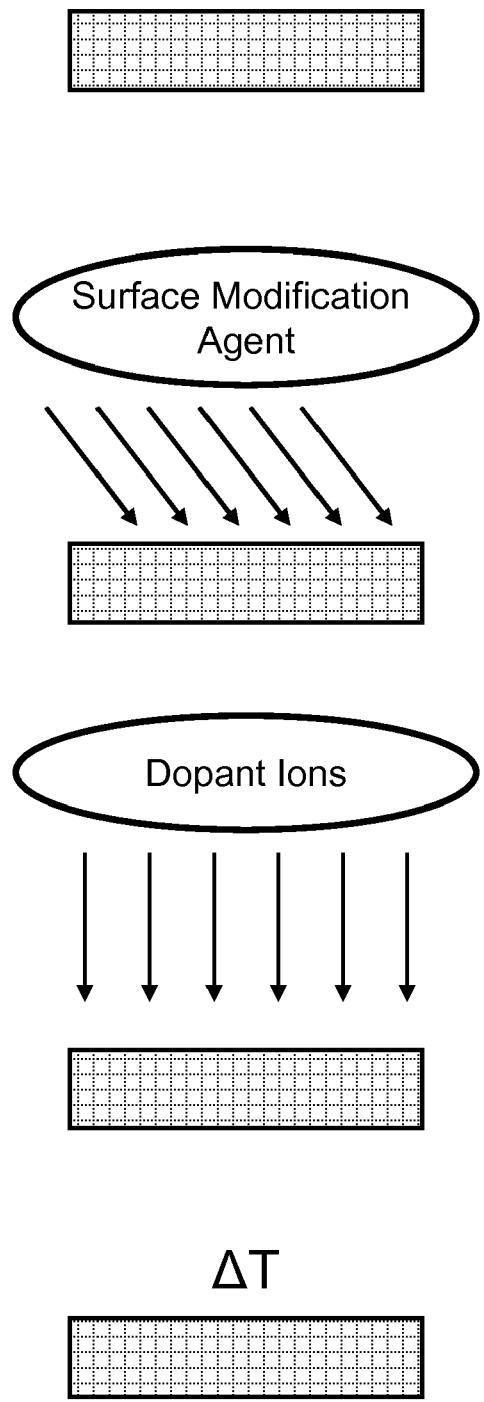
FIG. 1b illustrates an exemplary method for making a doped semiconductor structure.

FIG. 1b illustrates a similar embodiment, where the semiconductor is first treated with a surface modification agent, and subsequently implanted with dopants. Finally, the semiconductor is annealed under conditions where the temperature is ramped-up at a rate between 100 and 5000° C./second.

Figure 1C:
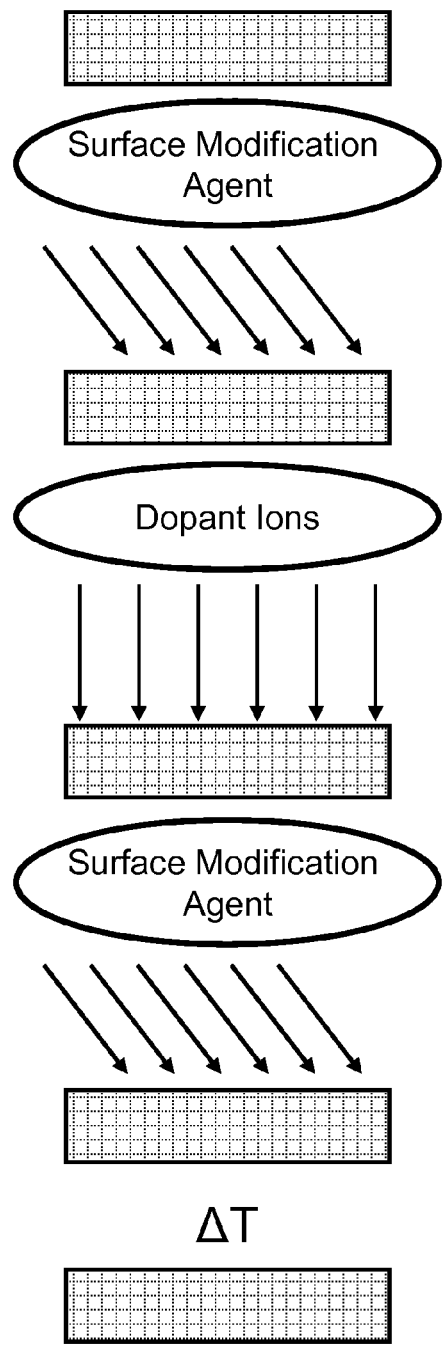
FIG. 1c illustrates an exemplary method for making a doped semiconductor structure.

FIG. 1c illustrates a third embodiment of a method for preparation of a doped semiconductor structure. In this method, the semiconductor is treated with a first surface modification agent, and subsequently the semiconductor is implanted with dopants. Before the final step of annealing, the semiconductor is treated with a second surface modification agent. In an embodiment, the first and second surface modification agents are the same. In another embodiment, the first and second surface modification agents are different. The treatment conditions (e.g., temperature, concentration, duration, pressure, etc.) under which the first and second surface modification agents are applied may be the same or different.

Figure 2:
FIG. 2 illustrates an exemplary method for making a doped semiconductor structure.
Figure 2:
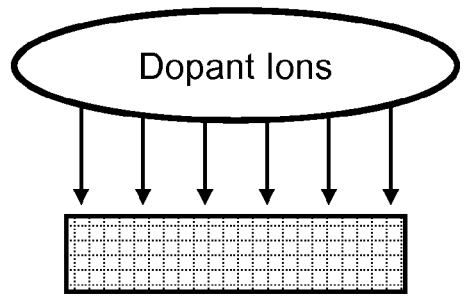
Figure 2:
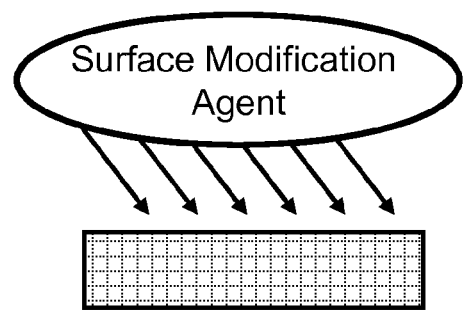
Figure 2:
Figure 2:

FIG. 2 illustrates a method according to another aspect for preparation of a doped semiconductor structure. In this method, the semiconductor is first implanted with dopants. The semiconductor is then treated with a surface modification agent. Subsequently, a solid interface is formed, grown, deposited, or otherwise disposed on the surface of the semiconductor. Finally, the semiconductor is annealed under conditions where the temperature is ramped-up at a rate between 100 and 500° C./second.

Figure 3:
FIG. 3 illustrates an exemplary method for making a doped semiconductor structure.
Figure 3:
Figure 3:
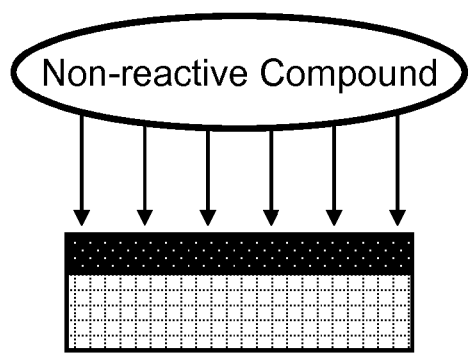
Figure 3:
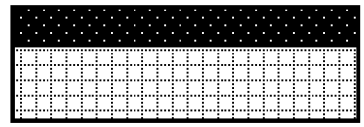
Figure 3:
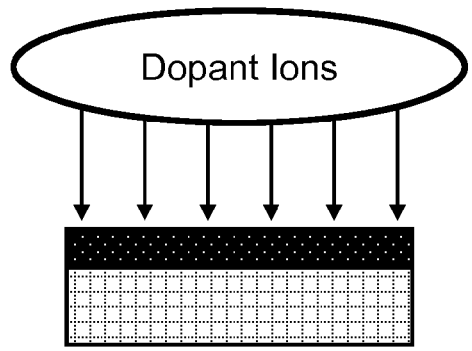
Figure 3:

FIG. 3 illustrates a method of this aspect where the solid interface is first formed on the semiconductor surface, followed by implantation with a non-reactive compound. Intermediately, the semiconductor is annealed, followed by dopant implantation. In the final step, the semiconductor is annealed to activate the implanted dopants. In the methods of this aspect, any annealing conditions sufficient to activate the implanted dopants may be utilized.

The invention may be further understood by the following non-limiting examples:

Example 1

Optimized Temperature Ramp Rates

Background. In "soak" annealing, a semiconductor wafer is held at constant temperature for several minutes. It is sometimes used for "solid phase epitaxial regrowth" (SPER), in which a doped layer of amorphous silicon is grown and then heated with the huge crystalline seed layer underneath to guide the crystal formation of the doped layer. Much research has gone into SPER, though it does not appear to be the method the semiconductor industry is moving toward.

In "spike" annealing, the temperature is ramped by incandescent light heating (after a temperature stabilization step of several tens of seconds at 600-800° C.) at 25-400° C./second up to typically about 1050° C. The dwell time near the top of the spike is 0.5-1 second, and is governed by the time it takes for lamps to cool down after power is cut.

There are two kinds of millisecond heating methods that the industry is moving toward. One is "flash" annealing, wherein the wafer is brought to a baseline temperature of several hundred degrees by conventional incandescent light, and then exposed to a pulse of light from a bank of flashlamps for about 1 millisecond. Only a thin skin of Si near the surface of the wafer is directly heated, but the skin is thick enough to encompass the devices on the surface. After the flashlamp exposure, rapid heat conduction from the skin into the underlying wafer rapidly cools the skin region back down on a millisecond time scale. To some extent, the heating rate can be varied by changing the timing of the electrical discharge that powers the flash. In "laser spike annealing" (LSA), a high-power continuous-wave laser is rastered across the wafer surface. The heating rate is set by the scan speed and/or the laser power.

Both flash and laser annealing are sometimes employed in various combinations with spike annealing, mainly because it is found empirically that the millisecond techniques do a comparatively poor job of removing implantation damage, which leads to harmful leakage currents in the final device. Up to now there has been little rational design for these recipes because the mechanisms by which millisecond annealing techniques achieve their improvements in dopant activation and diffusion (compared to spike annealing) were unknown. There have also been problems with metastability of the activated dopant in millisecond annealing; subsequent thermal steps tend to decrease the degree of dopant activation.

Utility of Millisecond Annealing. Interstitial clusters come in many sizes ranging up from two interstitial atoms. The activation energy for cluster dissociation exhibits significant size dependence. For example, initial dissociation events can have activation energies ranging from 1.4 eV for Si dimers up to 3.77 eV for large Si clusters. The number of dissociation pathways between these extremes is quite large if compositional and structural isomers including boron are taken into account. It is therefore plausible to describe these pathways using a nearly continuous distribution of dissociation energies. Whatever the cluster size, the dissociation rate constant exhibits a strong exponential variation with temperature. Thus during a ramp the clusters can be categorized as being in three classes: almost fully dissociated, presently dissociating, and not yet dissociated. At any given temperature, only the class in the "presently dissociating" class contributes significantly to interstitial release.

Interstitial clusters have a mixed composition of Si and dopant atoms. When the clusters dissociate, Si interstitials are liberated (which can be unfavorable), but dopant atoms are also liberated (which can be beneficial). The dopant interstitials are soon immobilized again, either by kicking into the lattice after migrating for a distance x_lattice, or by re-accreting (after moving a distance x_cluster) back onto other remaining interstitial clusters that have not yet dissociated. The mean free path of dopant interstitial motion when limited by clusters can be estimated from the distance between remaining clusters. In the simulations, the calculation is made from the concentration of the largest (nominally 8-atom) clusters. Earlier simulation models permitted the largest clusters to be only 5 atoms, and did not take into consideration contribution from these larger cluster sizes. Thus, x_cluster= ([size 8 clusters])$^{-1/3}$.

The mean free path of dopant interstitial motion when limited by lattice kick-in can be estimated from:

$$x_{lattice}^2 = 6\lambda^2 k_{assoc}[Si_i] t_{max} \exp[(E_{ki} - E_{diff,Bi})/kT](1-b)/b$$

where, $\lambda$ is a jump length for an interstitial atom (typically about 0.3 nm), $k_{assoc}$ denotes the rate constant for the association reaction between $B_s$ and $Si_i$, $[Si_i]$ is the concentration of interstitial silicon atoms, $t_{max}$ is a characteristic time over which the wafer remains near the peak temperature (i.e., within about 50° C. or within 95% of the peak temperature), $E_{ki}$ is the activation energy for kick-in of boron interstitial atoms into the host lattice, $E_{diff,Bi}$ is the activation energy for interstitial boron diffusion, and b is a branching ratio. The branching ratio b describing the pathways for the dissociation reaction of the complex ($B_s$—$Si_i$) to form $B_i$ and $Si_i$ is given by:

$$b = \frac{r_{(B_s-Si_i) \to Si_i+B_s}}{r_{(B_s-Si_i) \to Si_i+B_s} + r_{(B_s-Si_i) \to B_i+Si}}$$

Near the transistor junction, there are relatively few clusters and the distance of motion of the dopant is limited by kick-in to the lattice. This distance sets the scale of transient enhanced diffusion. Simulations show that in millisecond annealing, the rapid interstitial cluster dissociation induced by the fast ramping and higher maximum temperatures than spike annealing increase the Si interstitial concentration at the maximum temperature by about a factor of 20 (from $4 \times 10^{14}$ to $9 \times 10^{15}$ cm$^{-3}$). Silicon interstitials can be unfavorable because they kick dopant out of the lattice, making it mobile and electrically inactive. However, the profile is exposed to this higher concentration for times that are 1000 times less than in spike annealing. This effect more than counterbalances the increased concentration. Thus, millisecond annealing gives improved transient enhanced diffusion.

As for dopant activation, millisecond annealing gives improved results for a related but more subtle reason. Note that both $[Si_i]$ and [size 8 cluster] are a function of depth. To determine which mechanism for boron immobilization dominates, x_lattice and x_cluster can be plotted as a function of depth for spike and millisecond anneals. FIG. 4 shows typical experimental temperature trajectories. The results displayed in FIGS. 5A and 5B are calculated with a simulation model using typical experimental temperature trajectories. Flash annealing was employed as a specific case; the basic argument carries over for laser annealing. The values for x_cluster and x_lattice were calculated at the maximum temperature, i.e. top of the spike/flash as shown below, with two typical temperatures selected for each method.

Notice that x_cluster stays about the same for all conditions. The invariance with conditions simply means that none of the annealing protocols have dissociated the largest clusters. The shape of the curve basically reflects the concentration of largest clusters left over from implantation.

On the other hand, x_lattice varies quite a bit with annealing conditions. This quantity varies inversely with x_cluster (rising as x_cluster falls) because the silicon interstitial concentration tracks the concentration of largest clusters, not because the largest clusters are dissociating, but because clusters of all kinds tend to group together and have a maximum concentration near 4 nm for the implant conditions used here. As shown in FIG. 6, x_cluster is relatively insensitive to annealing conditions, indicating that large clusters are not dissociated; x_lattice, on the other hand, is smaller for flash anneals than spike anneals, indicating less diffusion. x_lattice decreases dramatically at all depths for the millisecond anneal, based on the equation given for x_lattice above. The intersection of x_cluster and x_lattice determines the transition of the dominating mechanism. The spike annealing protocol has a larger region where clusters are the principal immobilizing mechanism, as shown in FIG. 7. Areas 701 and 702 show regions of inactivated dopants. A larger fraction of the dopant (integrated over the entire profile) remains stuck in clusters for spike (areas 701 and 702) than millisecond/flash annealing (area 702 only). This effect drives up the sheet resistance.

Surface Effects. The surface plays a surprisingly small role in spike and millisecond annealing. The range of surface effects can extend down only roughly a distance of x_cluster into the bulk (~3 nm here). The effects of increasing the surface annihilation probability or surface loss probability, S, are therefore confined near the surface. Increasing S generally improves the fraction of dopant activated, but it also increases the dose loss (due to dopant interstitials being annihilated at the surface). Thus, whether the sheet resistance is better for spike or millisecond annealing is not obvious. In fact, simulations shown in FIGS. 8A and 8B indicate that as S increases, spike and millisecond annealing swap places briefly near s=0.01 with regard to sheet resistance, Rs.

The way to overcome this problem is to greatly increase x_cluster, which for practical purposes means dissociating most or all of the large clusters. A method for accomplishing this and also to get access to all the inactive dopant locked within the clusters is to heat the wafer high enough to dissociate all the clusters. With a value of S corresponding to conventional technology, well-known experiments and computations show that the extent of dopant diffusion would be much too great. The simulation results, depicted in Table 1, show that with S corresponding to the clean surface value for silicon (0.05), this would not be the case. The degree of spreading in general, however, cannot be known without reliable simulations.

TABLE 1

|  | Spike (expt) | Flash (expt) | Spike | Optimized ramp-rate |
|---|---|---|---|---|
| Ramp-rate (° C./s) | 160 | $2 \times 10^5$ | 160 | $3 \times 10^3$ |
| Tpeak (° C.) | 1050 | 1322 | 1258 | 1410 |
| S | $4.5 \times 10^{-5}$ | $8 \times 10^{-5}$ | 0.05 | 0.05 |
| $X_j$ (nm) | 36 | 19 | 21 | 20 |
| $R_s$ (Ω/sq) | 460 | 423 | 357 | 343 |

Boron might be segregating to the surface and lowering the value of S for boron (though maybe not Si) interstitials. This problem is avoided in pre-amorphized material, and there is a corollary benefit to using the clean surface, at least for soak annealing: the clean surface pulls out so many Si interstitials that "end-of-range" defects left over from pre-amorphization are dissolved.

Limits on Heating Rate. As discussed above, at any given time during a ramp, only some interstitial clusters are dissociating. Because of the strong exponential dependence of the dissociation rate on temperature, in practice only a very small fraction with a single, well-defined energy dissociate and liberate interstitials at any given time. A clean, closed-form analytical expression can be obtained, connecting each temperature in a linear ramp with the dissociation energy E* of the most active dissociating species:

$$(E^*/kT-\tfrac{1}{2})\exp(E^*/kT-\tfrac{1}{2})=vT/\beta$$

where v is the pre-exponential factor for dissociation, which should typically lie near the Debye frequency and $\beta$ is the heating rate. For simplified calculation of E*, this transcendental expression can be replaced by the analytical expression:

$$E^*/kT=\tfrac{1}{2}+Y-\ln Y+(\ln Y)/Y-(2-\ln Y)(\ln Y)/(2Y^2)$$

where $Y=\ln(vT/\beta)$.

From another perspective, these equations can be used to show that increasing the heating rate $\beta$ raises the temperature at which clusters with a given value of E* actively dissociates. This effect can be seen in Table 2. Even though the millisecond (flash) anneal goes to higher temperature, the maximum activation energy that dissociates during the annealing is less.

TABLE 2

| Anneal Type | Peak Temp. (° C.) | E* (eV) |
|---|---|---|
| Spike | 1000 | 3.14 |
| Spike | 1050 | 3.27 |
| Flash | 1256 | 2.906 |
| Flash | 1322 | 3.023 |

The activation energy for dissociation of the largest clusters is 3.77 eV according to our simulation model. Table 3 shows that for a flash anneal, one must heat the silicon wafer to 1713° C. in order to dissociate these clusters, which exceeds the melting point of silicon. Thus, the largest clusters cannot be dissociated in a millisecond anneal, and increasing S is unlikely to deliver major benefits. However, if one slows down the heating rate to the level at which the largest clusters just barely dissociate at the melting point of silicon (1410° C.), this requires an optimized heating rate of 3000° C./second. Table 1 shows that the predicted sheet resistance and junction depth (limited by diffusional spreading) is best at this heating rate and maximum temperature.

TABLE 3

|  | Spike | Flash | Optimized ramp-rate |
|---|---|---|---|
| Ramp-rate (° C./s) | 160 | $2 \times 10^5$ | 3.14 |
| $T_{peak}$ (° C.) | 1258 | 1713 | 1410 |
| E* (eV) | 3.8 | 3.8 | 3.8 |

In practice, it is unlikely that a real manufacturing process would drive the wafer all the way to the melting point for reasons of run-to-run variability. Still, this analysis gives clear kinetic guidance about how to do the optimization of ramp rate and temperature.

A more detailed analysis includes the heating protocols needed to remove end-of-range damage. The rate parameters for that dissociation are known only incompletely. But such defects tend to be extended, meaning that they tend to dissociate better when heated at lower temperatures for longer times. The "optimized" heating rate is a step in that direction compared to millisecond annealing. And with all clusters dissociated, these defects could "see" the beneficial effects of a high-S surface fully and potentially hasten their dissociation.

REFERENCES

M. Y. L. Jung, R. Gunawan, R. D. Braatz and E. G. Seebauer, "Ramp-Rate Effects on Transient Enhanced Diffusion and Dopant Activation: a Simple Explanation," *J. Electrochem. Soc.*, 150 (2003) G838-G842.

M. Y. L. Jung, R. Gunawan, R. D. Braatz and E. G. Seebauer, "Parameter Sensitivity Analysis of Boron Activation and Transient Enhanced Diffusion in Silicon," *J. Electrochem. Soc.*, 150 (2003) G758-G765.

E. G. Seebauer, "Quantitative Extraction of Continuous Distributions of Energy States and Pre-exponential Factors from Thermal Desorption Spectra," *Surface Science*, 316 (1994) 391-405.

Z. Du, A. F. Sarofim and J. L. Longwell, *Energy and Fuels* 4 (1990) 296.

S. H. Yeong, M. P. Srinivasan, B. Colombeau and Lap Chan, Ramam Akkipeddi, Charlotte T. M. Kwok, Ramakrishnan Vaidyanathan, and Edmund G. Seebauer, Defect Engineering by Surface Chemical State in Boron-Doped Pre-amorphized Silicon, *J. Appl. Phys.*, 91 (2007) 102112.

Example 2

Use of Solid Interfaces for Defect Engineering

Introduction. A substantial difference in diffusion profiles of arsenic implanted into silicon is observed when soak annealing is performed in the presence of a silicon dioxide overlayer grown at 630° C. vs. a native oxide grown at room temperature by simple exposure to air. Substantial differences in arsenic activation as measured by sheet resistance are also observed. Similar effects are observed for the fraction of arsenic dose retained.

In these cases, the oxide was formed before annealing took place. It is also possible to form or grow the oxide during the annealing step employed for activating the dopant. Varying the ambient gas pressure of oxygen results in significantly different degrees of boron diffusion, dose loss and fractional activation. In all cases, the results involved soak annealing and low pressures of oxygen: below $10^{-6}$ Torr. These low pressures would be difficult, though not impossible (with effort) to achieve in a conventional wafer processing tool. Indeed, related effects in a simple rapid thermal processing (spike anneal) tool operating at atmospheric pressure of nitrogen can be observed. A crude tool of this sort can have an ill-defined background level of oxygen and related oxygenated species such as water. Accordingly, results for boron in the spike annealing tool were found too difficult to reliably reproduce.

There are two ways in which the nature of the solid-solid interface can affect dopants. The effects outlined above probably result mainly from the dangling bond mechanism, though the electrostatic mechanism may play a role.

Effects of Dangling Bonds. One is the loss of interstitial atoms (and potentially vacancies) to dangling bonds. This is a generalization of the role of surface modifying agents, as shown above and in U.S. Provisional Patent Application No. 60/592,902 for "Methods for Controlling Dopant Concentration and Activation in Semiconductor Structures." Depending on how the silicon-solid interface is formed, and what material constitutes the non-silicon side of the interface, the annihilation probability for defects can be very different. In conventional planar silicon CMOS device technology, the solids forming interfaces with silicon include silicon dioxide, silicon oxynitrides of various compositions, silicon nitride, and, with the advent of "hi-k dielectrics" for transistor gates, various oxides and silicates of hafnium and zirconium.

In conventional CMOS technology, 2-dimensional simulations show that controlling the annihilation probability in the source and drain regions of a transistor will affect the dopant profile even under the gate (i.e., lateral to the surface, not just down into the bulk). However, simulations show that the value of the surface annihilation probability or surface loss probability, S, has a huge effect on the simulated diffusion profiles One can envision affecting the annihilation probability by any process that would affect the number of dangling bonds at the interface, and the strength of bonds already formed. Weaker bonds at the interface would be easier to rupture and incorporate defects such as interstitials. Thus, one could tailor the value of S at the interface by first adsorbing monolayer or submonolayer a surface modification agent such as oxygen, nitrogen or carbon, and then proceed forming the desired solid oxide, nitride, silicate, or the like. Adsorbing weakly bonded surface modification agents such as hydrogen or arsenic would also work. The ability of the interface to absorb defects would depend upon the modification agent chosen, the amount of it adsorbed, and the nature of the overlayer subsequently formed.

However, such interface engineering is likely to become very important. For example, within the next decade, so-called "3-dimensional" device structures such as FINFETs are likely to become more important commercially as device sizes continue to scale down.

Electrostatic Effects. U.S. Provisional Patent Application No. 60/592,902 for "Methods for Controlling Dopant Concentration and Activation in Semiconductor Structures" also describes an electrostatic mechanism for controlling defects, based on electrically charged defects that cause Fermi level pinning. Such effects could also be used for solid-solid interfaces. Obtaining precise control of such effects is still in its infancy. Small fluences of low-energy ion bombardment are known to induce band bending at the Silicon/$SiO_2$ interface.

Applications for such effects are starting to appear for applications other than Si CMOS, for example elemental mixing for III-V photonic integrated circuits. In this case, an InP surface is treated with an argon plasma, which induces damage on the surface and to some degree in a thin layer in the underlying bulk. A solid-solid interface is not clearly defined here, however, mainly surface effects. Such bombardment also induces formation of a thin, defected layer of solid that has a well-defined Fermi level.

Small amounts of surface modification agents placed at the interface as described above for dangling bond also permit an avenue of control, as does a graded continuous "interface" between a damaged bulk solid and the relatively undamaged bulk solid underneath.

REFERENCES

Ramakrishnan Vaidyanathan, Houda Graoui, Majeed Foad and Edmund G. Seebauer, "Influence of Surface Adsorption in Improving Ultrashallow Junction Formation," *Appl. Phys. Lett.* 89 (2006) 152114.

Ramakrishnan Vaidyanathan PhD Thesis, University of Illinois, 2007.

Charlotte Kwok PhD Thesis, University of Illinois, 2007.

Kapil Dev, M. Y. L. Jung, R. Gunawan, R. D. Braatz and E. G. Seebauer, "Mechanism for Coupling between Properties of Interfaces and Bulk Semiconductors," *Phys. Rev. B*, 68 (2003) 195311.

Kapil Dev and E. G. Seebauer, "Band Bending at the Si(100)—Si$_3$N$_4$ Interface Studied by Photoreflectance Spectroscopy," *Surface Science,* 583 (2005) 80-87.

C. Xu, T. Mei, M. Chin, J Dong, and S. Chua, "Built-in electric field enhancement/retardation on intermixing," *Appl. Phys. Lett.,* 91 (2007) 181111.

Example 3

Simulation Results

Simulations conducted illustrate that flash annealing is an improvement over spike. As shown in Table 4, a 20 times increase in Si interstitial concentration (from $4 \times 10^{14}$ to $9 \times 10^{15}$ cm$^{-3}$) is more than counterbalanced by the factor of 1000 decrease in time the profiles are exposed to these concentrations, resulting in an improvement in junction depth. FIGS. 5A and 5B show several examples of results distilled from the simulations according to the criteria shown above in Example 1.

TABLE 4

|  | Spike (1050° C.) | Flash (1322° C.) |
| --- | --- | --- |
| [Si$_i$] (cm$^{-3}$) | $4 \times 10^{14}$ | $9 \times 10^{15}$ |
| $t_{max}$ (S) | 0.6 | $6 \times 10^{-4}$ |
| x$_{lattice}$ (nm) | 22.7 | 4.8 |
| x (expt) (nm) | 21.5 | 4.7 |

FIGS. 9A and 9B illustrate two mechanisms by which boron is immobilized. In the first mechanism, FIG. 9A, a boron interstitial 901 is immobilized by kick-in into the semiconductor 902 lattice. In the second mechanism, FIG. 9B, a boron interstitial 903 is accreted into a boron 904 and semiconductor 905 cluster. FIG. 7 shows a cartoon representation of real simulations together with the spatial regions in which boron interstitial immobilization by clusters vs. the lattice takes place. The spike annealing has a larger region where clusters are the principal immobilizing mechanism. This cartoon could not have been drawn without the most recent version of the simulations, which incorporated a more realistic (8-atom) cluster model and a more realistic surface model and was the first version that accurately models both spike and flash annealing.

FIGS. 5A and 5B show that x_cluster will generally be smaller (thus, clustering is the more dominant mechanism for interstitial dopant removal) than x_lattice for the specific distance of 8-15 nm from the surface, a distance that is considerably greater than x_cluster itself. This means that for the surface to exert a significant effect into the underlying bulk, x_cluster has to increase to at least 8-15 nm. The easiest and most practical way to accomplish this and also to get access to all the inactive dopant locked within the clusters is to heat the wafer high enough to dissociate all the clusters. Releasing all the interstitials from clusters at once would lead to too much dopant diffusion during a typical annealing protocol; in fact, with a value of S corresponding to conventional technology, experiments and computations both show that the extent of diffusion would be much too great. The simulations shown in Table 1 illustrate that with S corresponding to the clean surface value for silicon, this would not be the case, but that dopant diffusion would be minimized, resulting in a shallow junction depth and low sheet resistance (due to higher activation of the implanted dopants).

Example 4

Nitridation of SiO$_2$ Interfacial Region

Nitridation of ultrathin SiO$_2$ films of less than 10 nm can be accomplished using N$_2$O, NO and NH$_3$. These three gases, however, exhibit different features in forming oxynitrides. In NO nitridation, N is introduced only in the near-interface region, being completely absent in the bulk and near-surface regions. FIG. 10 shows SIMS profiles of NO nitridation of silicon oxide as reported by Baumvol (Surface Science Reports, Volume 36, Issues 1-8, December 1999, Pages 1-166). Increasing annealing time increases N concentration in the near-interface region. N is predominantly Si—N bonded, like stoichiometric Si$_3$N$_4$. Only a minor portion of the N atoms presents a Si—N—O bond structure. Isotopic substitution studies showed that two nitridation mechanisms occur in parallel.

Without wishing to be bound by any particular theory, it is believed that NO diffuses through the silica network without reacting with it and reacts at the oxynitride/silicon interface to fix both N and O. This mechanism involves a minor fraction of the NO molecules entering the oxynitride network. Initially, the amounts of N and O fixed in the near-interface region are comparable, but after a certain time, the concentration of O overcomes that of N. The time at which this transition occurs depends upon the initial oxide thickness. This mechanism is consistent with the formation of one monolayer of Si$_3$N$_4$ at the interface, followed by a layer of SiN$_x$O$_y$ in the near-interface region. As the nitridation time proceeds, the SiN$_x$O$_y$ zone, and eventually the Si$_3$N$_4$ monolayer are enriched in O.

N$_2$O nitridation also leads to N incorporation in the near interface region of the films. However, exposure to N$_2$O results in higher growth rates and causes significant film growth, in such a way that the incorporated N accumulates near the new interface. As a result, increasing annealing time promotes a shift of the leading edge of the N profile towards higher depths, following the newly advancing oxynitride/silicon interface. This contrasts with the situation of exposure to NO, where annealing in NO does not shift the leading edge of the N profile.

Annealing in NH$_3$ also leads to accumulation of the N, but both in the near-surface and near-interface regions. For long annealing times and high temperatures, N is furthermore incorporated into the bulk of the silicon oxide films. Along with N, significant amounts of H are also incorporated. The process is driven by reaction between NH$_3$ and SiO$_2$, where H bridges the reaction of N with SiO$_2$. The reaction occurs preferably in the near-surface region because the water created can escape from the material into the NH$_3$ ambient or near the interface, from where it reoxidizes the silicon substrate.

These observations indicate that surface modification is possible by exposing a Si substrate having an uppermost SiO$_2$ layer to NO, N$_2$O or NH$_3$. Specifically, nitridation in an NO atmosphere creates true Si$_3$N$_4$ at the SiO$_2$/Si interface. Control of the exposure time allows for control of the amount of nitridation at the SiO$_2$/Si interface. For situations where true bulk oxynitride is desired, nitridation of thin SiO$_2$ films in a NH$_3$ atmosphere, however, is required.

In summary, control over the concentration and profile of N at the SiO$_2$/Si interface can be achieved by adjustment of the exposure conditions (identity of nitridation gas, pressure, temperature and exposure time). This allows for control over the silicon properties during annealing, including interstitial annihilation rates, dopant activation rates and dopant diffusion rates.

Example 5

Interface Annihilation Rates Study

The annihilation rate of interstitial atoms was studied experimentally. Five samples were prepared under the following conditions. Native cSi with a clean surface was implanted with a 1 keV $^{30}$Si at a dose of $1\times10^{15}$. The samples were then oxidized ex-situ in a dry oxygen furnace to grow 3.0 nm of oxide on the surface. Different 1 keV Ar implantation doses were then applied to three of the samples to disrupt the Si/SiO$_2$ interface: $3\times10^{13}$, $1\times10^{14}$, $3\times10^{14}$ and $1\times10^{15}$. The fifth sample was not implanted as a control sample. The samples were finally annealed at 850° C. for 60 minutes. The Ar implanted samples were then analyzed using TOF-SIMS; the concentration profiles for $^{30}$Si are shown in FIG. 11A. The $1\times10^{15}$ sample is not shown in FIG. 11A for clarity. FIG. 11B shows an expanded view of the $^{30}$Si concentration profiles. The $3\times10^{14}$ sample is not shown in FIG. 11B for clarity.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

U.S. provisional patent application entitled "Preparation of Ultra-Shallow Semiconductor Junctions Using Intermediate Temperature Ramp Rates and Solid Interfaces For Defect Engineering," filed Mar. 19, 2008 and having Ser. No. 61/037,882, is herein incorporated by reference in its entirety to the extent not inconsistent with the present description. U.S. non-provisional patent application entitled "Methods for Controlling Dopant Concentration and Activation in Semiconductor Structures," filed Jul. 28, 2005 and having Ser. No. 11/192,339, is herein incorporated by reference in its entirety to the extent not inconsistent with the present description.

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art.

When a group of substituents is disclosed herein, it is understood that all individual members of those groups and all subgroups, including any isomers and enantiomers of the group members, and classes of compounds that can be formed using the substituents are disclosed separately. When a compound is claimed, it should be understood that compounds known in the art including the compounds disclosed in the references disclosed herein are not intended to be included. When a Markush group or other grouping is used herein, all individual members of the group and all combinations and subcombinations possible of the group are intended to be individually included in the disclosure.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomers and enantiomer of the compound described individual or in any combination. One of ordinary skill in the art will appreciate that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

I claim:

1. A method of making a doped semiconductor structure, the method comprising the steps of:
    providing a semiconductor;
    implanting said semiconductor with dopants;
    treating said semiconductor with a surface modification agent; and
    annealing said semiconductor using a temperature ramp-up rate selected from 1500 to 4500° C./second, thereby making said doped semiconductor structure.

2. The method of claim 1 wherein said temperature ramp-up rate is selected from 2000 to 3500° C./second.

3. The method of claim 1 further comprising the step of controlling a temperature ramp-down rate of the semiconductor after annealing.

4. The method of claim 3 wherein said temperature ramp-down rate is selected from the range of 100 to 5000° C./second.

5. The method of claim 3 wherein said temperature ramp-down rate has the same magnitude as said temperature ramp-up rate.

6. The method of claim 1 wherein said annealing step raises a temperature of a surface of said semiconductor to a peak temperature selected from the range of 600° C. to 1500° C.

7. The method of claim 6 wherein said peak temperature is selected from the range of 1200 to 1410° C.

8. The method of claim 6 wherein said annealing step raises the temperature of said surface of said semiconductor to a temperature within 50° C. of said peak temperature for a time period selected from 0.1 ms to 90 minutes.

9. The method of claim 1 wherein said step of treating establishes on a surface of said semiconductor a surface population of surface modification groups selected from 0 to 3 monolayers.

10. The method of claim 9 wherein said semiconductor has a surface population of surface modification groups selected from 0.001 to 1.5 monolayers.

11. The method of claim 1 wherein said step of treating establishes on a surface of said semiconductor a surface population of surface modification groups selected from the range of $1 \times 10^{12}$ molecules/cm$^2$ to $2 \times 10^{15}$ molecules/cm$^2$.

12. The method of claim 1 wherein said surface modification agent is a hydrogen donating compound.

13. The method of claim 12 wherein said hydrogen donating compound is selected from the group consisting of liquid HF acid and gaseous $H_2$.

14. The method of claim 1 wherein said surface modification agent is an oxygen donating compound.

15. The method of claim 14 wherein said oxygen donating compound is selected from the group consisting of $O_2$ and $NO_2$.

16. The method of claim 1 wherein said surface modification agent is a nitrogen donating compound.

17. The method of claim 16 wherein said nitrogen donating compound is selected from the group consisting of $NH_3$, NO, $N_2O$ and $N_2H_2$.

18. The method of claim 1 wherein said surface modification agent is a halogen-donating compound.

19. The method of claim 18 wherein said surface modification agent is selected from the group consisting of HCl, $Cl_2$, HF and $F_2$.

20. The method of claim 1 wherein said semiconductor has an atomically clean surface.

21. The method of claim 1 wherein at least a portion of a surface of said semiconductor is atomically clean.

22. The method of claim 1 wherein at least a portion of a surface of said semiconductor has dangling bonds.

23. The method of claim 1 wherein said doped semiconductor is an ultra-shallow semiconductor junction.

24. The method of claim 23 wherein said semiconductor junction has a junction depth selected from the range of 5 to 100 nm.

25. The method of claim 1 wherein said semiconductor has a concentration of activated dopants selected from the range of $1 \times 10^{18}$ to $5 \times 10^{21}$ dopants/cm$^3$.

26. The method of claim 1 wherein said semiconductor comprises a group IV semiconductor.

27. The method of claim 26 wherein said group IV semiconductor is selected from the group consisting of Si and Ge.

28. The method of claim 1 wherein said semiconductor comprises a III-V semiconductor.

29. The method of claim 28 wherein said III-V semiconductor is selected from the group consisting of gallium arsenide and indium phosphide.

30. The method of claim 1 wherein said semiconductor comprises a II-VI semiconductor.

31. The method of claim 30 wherein said II-VI semiconductor is cadmium selenide.

32. The method of claim 1 wherein said semiconductor comprises a solid solution with a continuously variable composition.

33. The method of claim 32 wherein said continuously variable composition comprises $Si_xGe_{1-x}$ or $Ga_xIn_{1-x}As_yP_{1-y}$.

34. The method of claim 1 wherein said dopants are electrically active within said doped semiconductor structure.

35. The method of claim 1 wherein said dopants are selected from the group consisting of boron, arsenic, antimony, phosphorus, silicon, and beryllium.

36. The method of claim 1 wherein said semiconductor has one or more relief features, channels, depressions, vias, plug holes, trenches, or raised source-drain structures.

37. The method of claim 1 further comprising the step of implanting said semiconductor structure with a non-reactive compound or a reactive compound.

38. The method of claim 37 wherein said non-reactive compound is selected from the group consisting of a semiconductor atom, a semiconductor ion, a noble gas atom, a noble gas ion, a dopant atom, a dopant ion, clusters of any these and clusters of any combination of these.

39. The method of claim 37 wherein said reactive compound is selected from the group consisting of nitrogen containing compounds, fluorine containing compounds and oxygen containing compounds.

40. The method of claim 37 wherein said implanted non-reactive or reactive compound is implanted at a preselected concentration so as to achieve a preselected dopant profile.

41. The method of claim 37 wherein said implanted non-reactive or reactive compound modifies an annihilation probability for interstitial atoms.

42. The method of claim 1 further comprising the step of forming a solid interface on a surface of said semiconductor.

43. The method of claim 42 wherein said step of forming a solid interface on the surface of said semiconductor occurs after said step of treating said semiconductor with a surface modification agent.

44. The method of claim 42 wherein said step of forming a solid interface on the surface of said semiconductor occurs before said step of treating said semiconductor with a surface modification agent.

45. The method of claim 44 wherein said treating step results in formation of dangling bonds at said interface.

46. The method of claim 42 wherein said solid interface comprises an interface between said surface of said semiconductor and a solid layer disposed thereon.

47. The method of claim 46 wherein said surface modification agent is a gas.

48. The method of claim 47 wherein said surface modification agent diffuses through said solid layer.

49. The method of claim 48 wherein said surface modification agent is substantially not present in said solid layer after said treating step is terminated.

50. The method of claim 48 wherein said surface modification agent does not modify said solid layer.

51. The method of claim 46 wherein said solid layer is grown or deposited on the surface of said semiconductor.

52. The method of claim 46 wherein said solid layer comprises a dielectric layer.

53. The method of claim 46 wherein said solid layer comprises material selected from the group consisting of oxides, nitrides, and silicates.

54. The method of claim 53 wherein said solid layer comprises oxides, nitrides or silicates of the underlying semiconductor.

55. The method of claim 53 wherein said solid layer comprises oxides, nitrides, or silicates of a metallic element.

56. The method of claim 55 wherein said metallic element is hafnium, zirconium, or titanium.

57. The method of claim 46 wherein said solid layer has a thickness selected from the range of 0.5 to 100 nm.

58. The method of claim 46 wherein said solid layer does not cover said surface of said semiconductor entirely.

59. The method of claim 46 wherein said solid layer has a non-uniform thickness across the surface of said semiconductor.

60. The method of claim 46 wherein said solid layer is grown or deposited onto said surface of said semiconductor.

61. The method of claim 46 wherein said solid layer is mechanically attached to said surface of said semiconductor.

62. The method of claim 46 wherein said solid layer is prepared via a chemical reaction within or on said surface of said semiconductor.

63. The method of claim 42 wherein said solid interface acts as a sink for interstitial semiconductor atoms.

64. The method of claim 42 wherein said solid interface controls a surface abundance of dangling bonds at said surface of said semiconductor.

65. The method of claim 42 wherein said solid interface controls a surface abundance of diffusion control groups on said surface of said semiconductor.

66. The method of claim 42 wherein said solid interface is formed during said step of implanting said semiconductor with dopants.

67. The method of claim 42 further comprising the step of implanting said semiconductor structure with a non-reactive compound or a reactive compound.

68. The method of claim 67 wherein said non-reactive compound is selected from the group consisting of a semiconductor atom, a semiconductor ion, a noble gas atom, a noble gas ion, a dopant atom, a dopant ion, clusters of any these and clusters of any combination of these.

69. The method of claim 67 wherein said reactive compound is selected from the group consisting of nitrogen containing compounds, fluorine containing compounds, phosphorus containing compounds and oxygen containing compounds.

70. The method of claim 67 wherein said implanted non-reactive or reactive compound disrupts the solid interface so as to achieve a preselected dopant profile.

71. The method of claim 67 wherein said implanted non-reactive or reactive compound modifies an annihilation probability for interstitial atoms.

72. A method of forming an ultra-shallow semiconductor junction, the method comprising the steps of:
providing a semiconductor;
implanting said semiconductor with dopants;
annealing said semiconductor using a temperature ramp-up rate selected from the range of 1500 to 4500° C./second, thereby making said ultra-shallow semiconductor junction, wherein said semiconductor junction has a junction depth selected from 5-100 nm.

73. The method of claim 72 wherein said annealing step raises a temperature of a surface of said semiconductor to a peak temperature selected from the range of 600 to 1500° C.

74. The method of claim 73 wherein said peak temperature is selected from the range of 1200 to 1410° C.

75. The method of claim 73 wherein said annealing step raises the temperature of a surface of said semiconductor to a temperature within 50° C. of the peak temperature for a time period selected from 0.1 ms to 90 minutes.

76. The method of claim 72 wherein said junction depth is selected from the range of 5 to 25 nm.

* * * * *